United States Patent
Chen et al.

(10) Patent No.: US 11,574,693 B2
(45) Date of Patent: Feb. 7, 2023

(54) MEMORY APPARATUS AND METHOD OF OPERATION USING PERIODIC NORMAL ERASE DUMMY CYCLE TO IMPROVE STRIPE ERASE ENDURANCE AND DATA RETENTION

(71) Applicant: SanDisk Technologies LLC, Addison, TX (US)

(72) Inventors: Chin-Yi Chen, San Jose, CA (US); Muhammad Masuduzzaman, Chandler, AZ (US); Dengtao Zhao, Kumar, CA (US); Anubhav Khandelwal, San Jose, CA (US); Ravi Kumar, Redwood City, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/347,772

(22) Filed: Jun. 15, 2021

(65) Prior Publication Data

US 2022/0399066 A1  Dec. 15, 2022

(51) Int. Cl.
| G11C 16/04 | (2006.01) |
| G11C 16/34 | (2006.01) |
| G11C 16/08 | (2006.01) |
| G11C 16/28 | (2006.01) |
| G11C 16/16 | (2006.01) |

(52) U.S. Cl.
CPC ......... *G11C 16/3495* (2013.01); *G11C 16/08* (2013.01); *G11C 16/16* (2013.01); *G11C 16/28* (2013.01); *G11C 16/3404* (2013.01)

(58) Field of Classification Search
CPC ........................................ G11C 16/16
USPC ...................................... 365/185.29
See application file for complete search history.

(56) References Cited

U.S. PATENT DOCUMENTS

| 8,315,093 | B2 | 11/2012 | Dong et al. |
| 8,427,874 | B2 | 4/2013 | Kato |
| 9,224,494 | B2 | 12/2015 | Chin et al. |
| 9,318,206 | B2 | 4/2016 | Dong et al. |
| 9,406,387 | B2 | 8/2016 | Yuan et al. |
| 9,552,885 | B2 | 1/2017 | Shukla et al. |
| 10,923,197 | B2 | 2/2021 | Lu et al. |
| 11,120,880 | B1 * | 9/2021 | Wang ............... G11C 16/16 |
| 2014/0247666 | A1 * | 9/2014 | Dutta .............. G11C 11/5635 365/185.24 |
| 2021/0027850 | A1 | 1/2021 | Yang et al. |

* cited by examiner

*Primary Examiner* — Hoai V Ho
(74) *Attorney, Agent, or Firm* — Dickinson Wright PLLC; Steven C. Hurles

(57) ABSTRACT

A memory apparatus and method of operation are provided. The apparatus includes memory cells connected to one of a plurality of word lines and arranged in strings and configured to retain a threshold voltage corresponding to one of a plurality of memory states. A control circuit is coupled to the plurality of word lines and strings and is configured to erase the memory cells using a stripe erase operation in response to determining a cycle count is less than a predetermined cycle count maximum threshold. The control circuit is also configured to perform a dummy cycle operation in response to determining the cycle count is not less than the predetermined cycle count maximum threshold.

20 Claims, 18 Drawing Sheets

MEMORY APPARATUS AND METHOD OF OPERATION USING PERIODIC NORMAL ERASE DUMMY CYCLE TO IMPROVE STRIPE ERASE ENDURANCE AND DATA RETENTION

FIELD

This application relates to non-volatile memory apparatuses and the operation of non-volatile memory apparatuses.

BACKGROUND

This section provides background information related to the technology associated with the present disclosure and, as such, is not necessarily prior art.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

For some memory arrays, the array is arranged as a number of parallel word lines and a number of bit lines that run perpendicular to the word lines. Each memory cell may be associated with one word line and one bit line. In certain situations, a memory cell can be affected by the charge stored on the floating gate of an adjacent memory cell on a neighboring word line and/or neighboring bit line.

The charge on an adjacent floating gate can also interfere with the conductive channel in the substrate below the floating gate of a memory cell. Specifically, the charge on the adjacent floating gate may impact how strongly the channel of another memory cell conducts a current. Thus, if the charge stored in an adjacent floating gate changes, then it may require a greater (or smaller) voltage on the control gate the other memory cell to create the same current in the channel. The net impact is that the amount of charge stored on the memory cell appears to be different due to the change in the charge stored in the adjacent floating gate. This problem is most pronounced between sets of adjacent memory cells that have been programmed at different times. Herein, this adjacent floating gate to channel effect may be referred to as another type of "adjacent floating gate charge coupling effect."

Another problem with memory cells is that over time charge can accumulate in a dielectric near the floating gate. For example, when programming a memory cell, charge can become trapped in a tunnel oxide layer below the floating gate of the memory cell. Erasing the memory cell may not completely remove the trapped charge. With each program/erase cycle, the amount of trapped charge increases. In addition, under certain conditions, electrons can accumulate in a parasitic region of the charge trapping layer. Such accumulation of electrons can affect data retention and cause memory cells to become more difficult to erase. Thus, there is a need for improved non-volatile memory apparatuses.

SUMMARY

This section provides a general summary of the present disclosure and is not a comprehensive disclosure of its full scope or all of its features and advantages.

An object of the present disclosure is to provide a memory apparatus and a method of operating the memory apparatus that address and overcome the above-noted shortcomings.

Accordingly, it is an aspect of the present disclosure to provide an apparatus including memory cells connected to one of a plurality of word lines and arranged in strings and configured to retain a threshold voltage corresponding to one of a plurality of memory states. A control circuit is coupled to the plurality of word lines and strings and is configured to erase the memory cells using a stripe erase operation in response to determining a cycle count is less than a predetermined cycle count maximum threshold. The control circuit is also configured to perform a dummy cycle operation in response to determining the cycle count is not less than the predetermined cycle count maximum threshold.

According to another aspect of the disclosure, a controller in communication with a memory apparatus including memory cells connected to one of a plurality of word lines and arranged in strings and configured to retain a threshold voltage corresponding to one of a plurality of memory states is also provided. The controller is configured to instruct the memory apparatus to erase the memory cells using a stripe erase operation in response to determining a cycle count is less than a predetermined cycle count maximum threshold. The controller is also configured to instruct the memory apparatus to perform a dummy cycle operation in response to determining the cycle count is not less than the predetermined cycle count maximum threshold.

According to an additional aspect of the disclosure a method of operating a memory apparatus is provided. The memory apparatus includes memory cells connected to one of a plurality of word lines and arranged in strings and configured to retain a threshold voltage corresponding to one of a plurality of memory states. The method includes the step of erasing the memory cells using a stripe erase operation in response to determining a cycle count is less than a predetermined cycle count maximum threshold. The method also includes the step of performing a dummy cycle operation in response to determining the cycle count is not less than the predetermined cycle count maximum threshold.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 15:
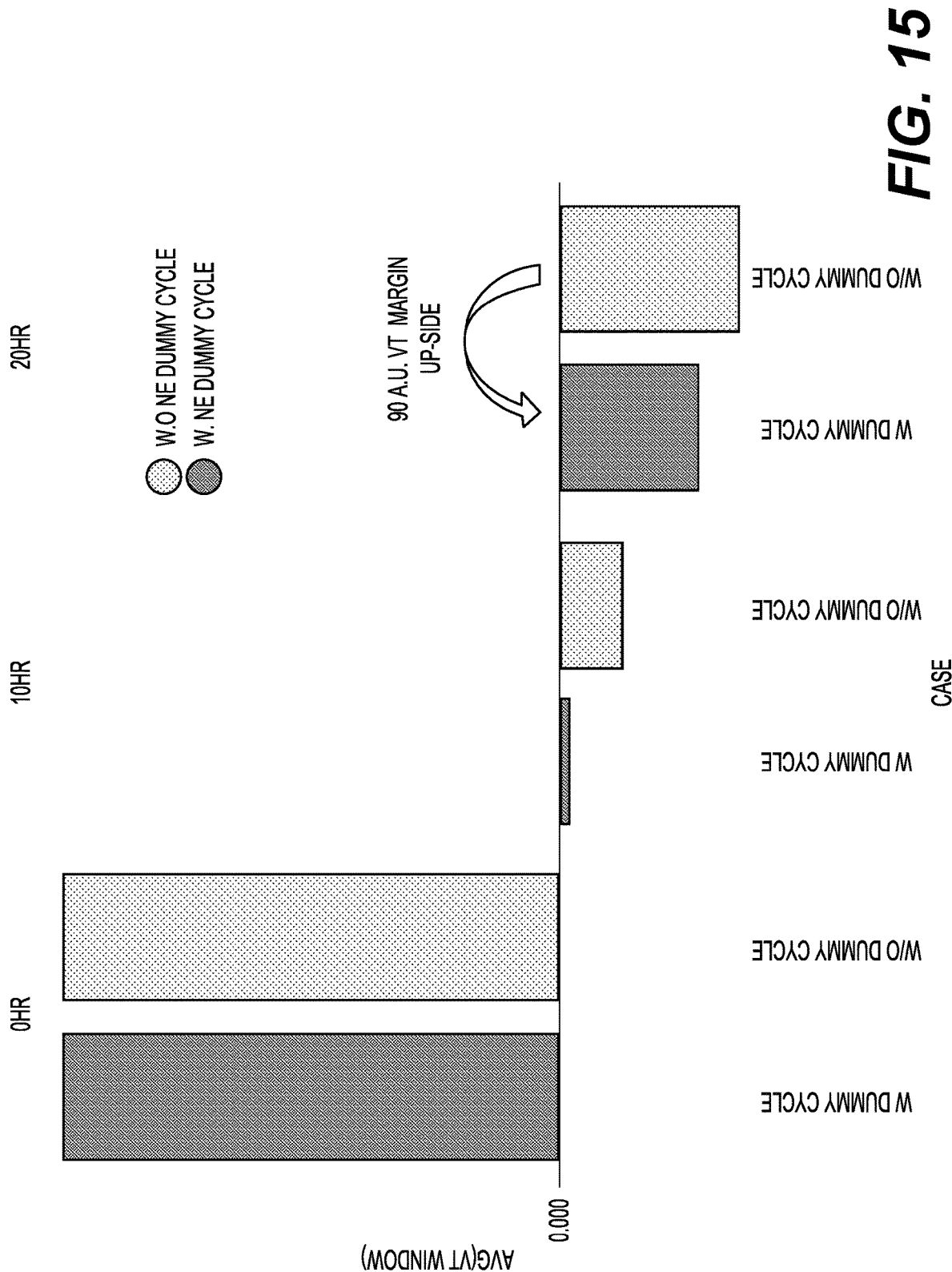
Figure 16:
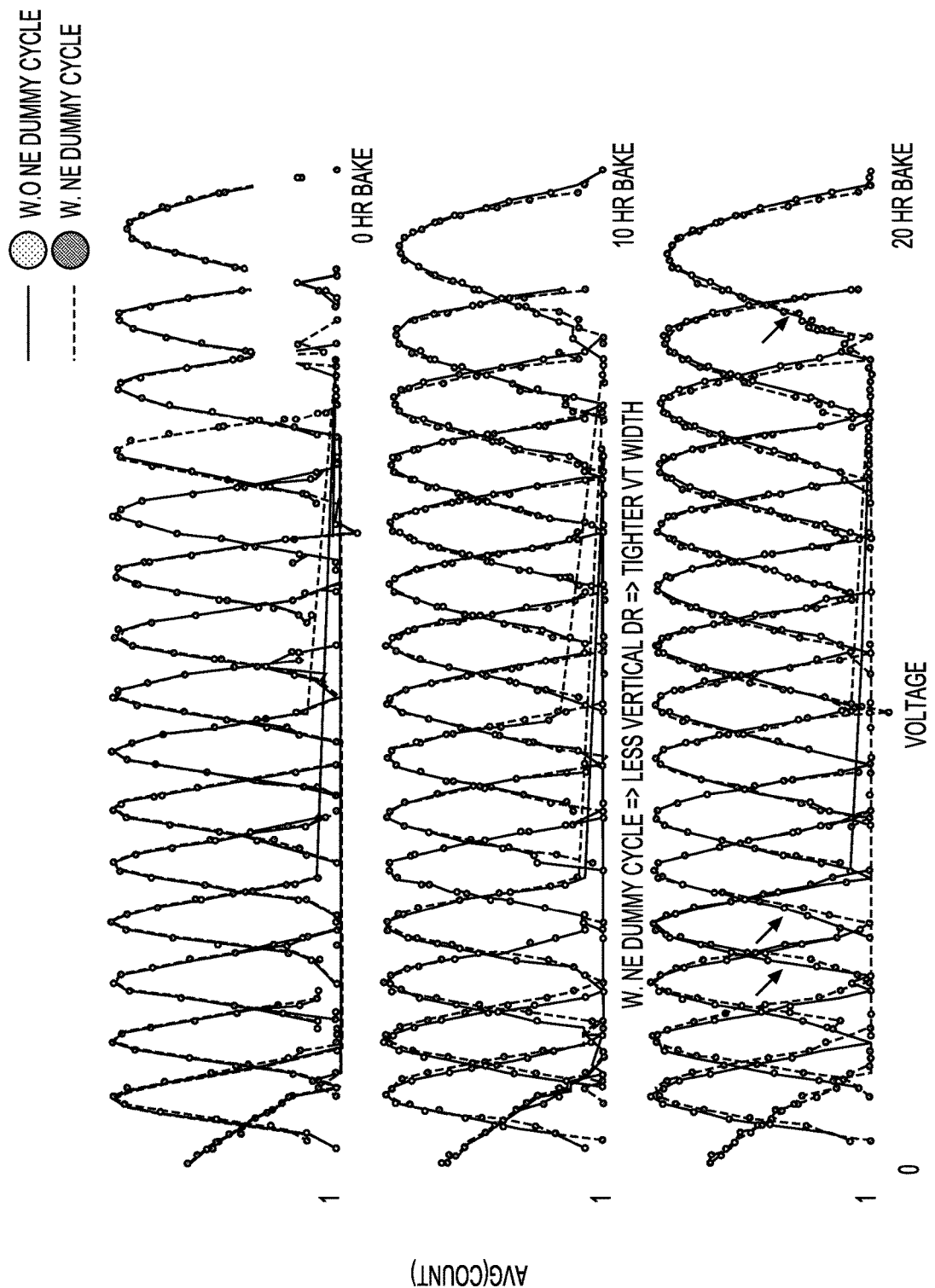
Figures 17A, 17B:
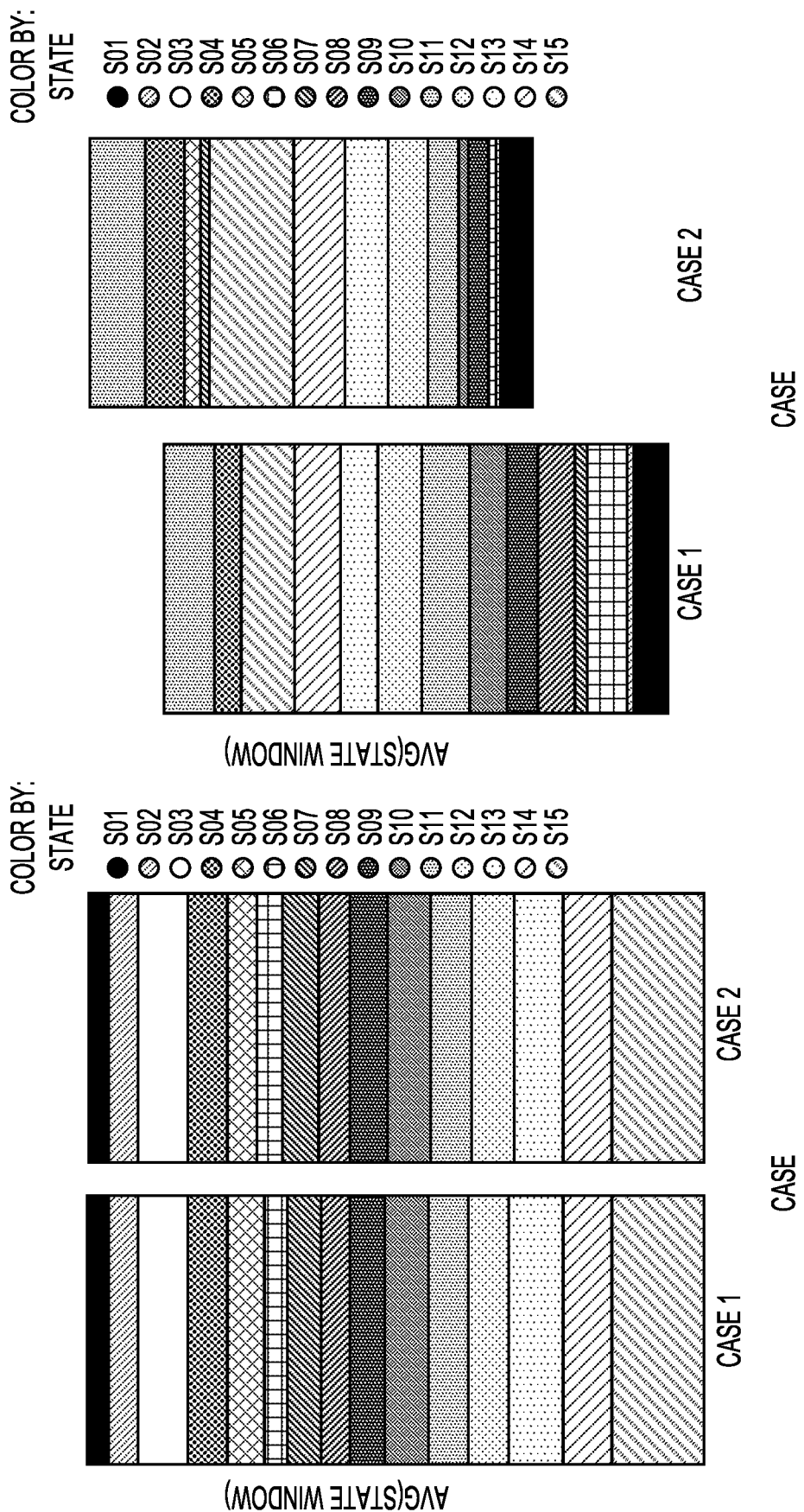

FIGS. 15 and 16 show threshold voltages after high temperature data retention testing for various lengths of time for one particular word line that has been cycled according to aspects of the disclosure; and FIGS. 17A and 17B show state dependent threshold voltage windows after 0 hours and after 10 hours according to aspects of the disclosure.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of operation of this disclosure will be described in conjunction with one or more example embodiments involving optimizing an erase operation in a memory device or apparatus to compensate for erase speed variations due to factors such as blocking oxide layer thinning. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

In some memory devices, memory cells are joined to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells.

The memory cells can include data memory cells, which are eligible to store user data, and dummy or non-data memory cells which are ineligible to store user data. A dummy memory cell may have the same construction as a data memory cell but is considered by the controller to be ineligible to store any type of data including user data. A dummy word line is connected to a dummy memory cell. One or more dummy memory cells may be provided at the drain and/or source ends of a string of memory cells to provide a gradual transition in the channel voltage gradient.

In some 3D memory structures, the memory cells are arranged in vertical NAND strings (or other sets of connected memory cells) in a stack, where the stack comprises alternating conductive and dielectric layers. In this structure, the conductive layers act as word lines which are connected to the memory cells. Further, the memory cells may be formed by annular layers of blocking oxide, charge-trapping material, tunnel oxide and channel polysilicon which extend in the stack. The blocking oxide layer separates the charge trapping layer from the word line so that charges in the charge trapping layer are blocked from reaching the word line.

The layers may be arranged concentrically. Each NAND string may have the shape of a pillar which intersects with the word lines to form the memory cells.

Each memory cell may be associated with a data state according to write data in a program command based on its data state, a memory cell will either remain in the erased state or be programmed to a programmed data state. For example, in a single bit per cell memory device, also referred to as SLC, or single level cell, there are two data states including the erased state and the programmed state. MLC or multi-level cells store two or more bits per cell, as a multiple bit memory cell. For example, in a two-bit per cell memory device, there are four data states including the erased state and three higher data states referred to as the A, B and C data states (see FIG. 7). In a three-bit per cell memory device, there are eight data states including the erased state and seven higher data states referred to as the A-G data states. In a four-bit per cell memory device, there are sixteen data states including the erased state (S0) and fifteen higher data states, S0-S15.

A program operation may use a set of increasing program voltages or pulse which are applied to the word line in respective program loops or program-verify iterations in one or more program passes.

Verify tests may be performed after each program voltage to determine whether the memory cells have completed programming A verify test can involve applying a verify voltage of an assigned data state to the selected word line while sensing circuitry determines whether cells connected to the word line are in a conductive or non-conductive state. As in a read operation, the voltages of the unselected word lines are set to a read pass voltage which is high enough to place the unselected memory cells in a strongly conductive state, to avoid interfering with the sensing of the selected memory cells. If a memory cell is in a non-conductive state, the threshold voltage (Vth, Vt, or $V_{TH}$) of the memory cell exceeds the control gate voltage and the memory cell has reached the assigned data state. Programming is thus completed for the memory cell, and it can be locked out from further programming while programming continues for other memory cells in subsequent program loops.

After the memory cells are programmed, the data can be read back in a read operation. A read operation can involve applying a series of read voltages to a word line while sensing circuitry determines whether cells connected to the word line are in a conductive or non-conductive state. If a memory cell is in a non-conductive state, the threshold voltage Vth of the memory cell exceeds the read voltage. The read voltages are set at levels which are expected to be between the threshold voltage levels of adjacent data states. During the read operation, the voltages of the unselected word lines are set at a read pass voltage which is high enough to place the unselected memory cells in a strongly conductive state, to avoid interfering with the sensing of the selected memory cells.

An erase operation involves transitioning the memory cells from the programmed state to an erased state. During the erase operation, it is desired to lower the threshold voltage Vth of each memory cell below an erase-verify level which represents an erased data state. An erase operation can include a number of erase loops, where each loop comprises an erase portion follow by a verify portion. In the erase portion, voltages are applied to the block to provide a positive channel-to-gate voltage for the memory cells of the block to drive electrons out of the charge-storing material of the cells, thereby reducing the Vth of the memory cells. In the verify portion, a verify voltage is applied to the control gates of the memory cells via the word lines of the block, and sensing circuitry is used to sense currents in the NAND strings to determine if the memory cells have been sufficiently erased.

A positive channel-to-gate voltage is obtained by charging up (increasing a voltage of) the channels of the NAND strings by introducing holes (positive charges) into the channel One approach is to generate holes by gate-induced drain leakage (GIDL) at the SGD transistors of the NAND strings. GIDL can be generated in proportion to a drain-to-gate voltage of the SGD transistors, where the drain voltage is equal to the bit line voltage.

The memory cells may also be erased in a stripe erase operation. Instead of all of the memory cells connected to all word lines associated with a block being erased at a time, memory cells associated with every other word line of the block are erased simultaneously and then the memory cells associated with the remaining word lines of the block are erased simultaneously (e.g., all even word lines first and then all odd word lines next). This is known as a "stripe erase" and causes holes to be localized beneath word lines in a charge trapping layer. However, after cycling, electrons may accumulate in a parasitic region in the charge trapping layer between word lines and make strings harder to erase.

Techniques provided herein address the above and other issues. In particular, an erase operation accounts for different erase speeds of different strings of a block based on the positions of the strings in the block and based on the corresponding blocking oxide layer thickness associated with the position. These and other features are discussed further below.

Figure 1:
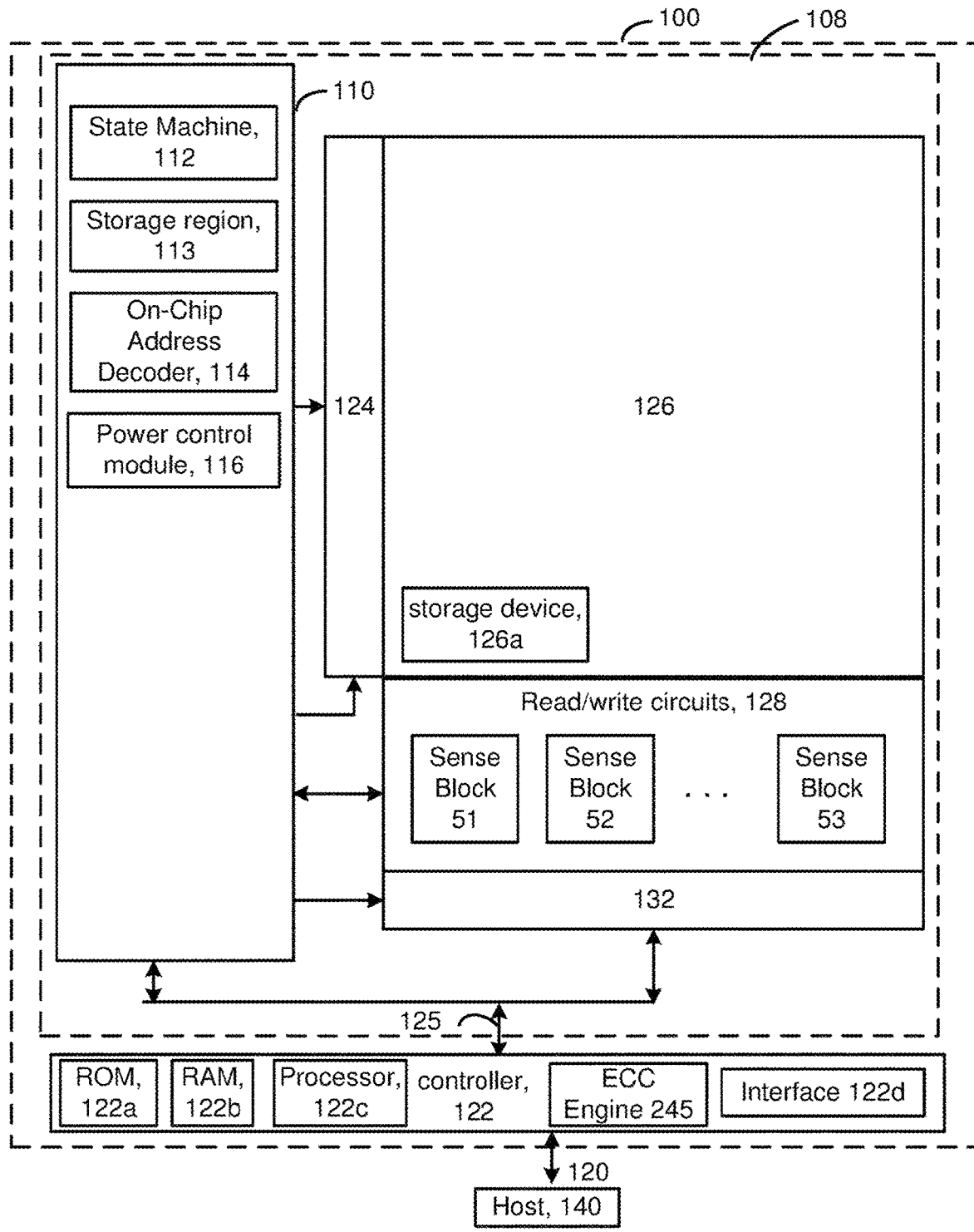
FIG. 1 is a block diagram of an example memory device according to aspects of the disclosure.

FIG. 1 is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 125.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116 (power control circuit). The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. The control circuit is configured to program memory cells by applying one or more program pulses to a selected word line, and to apply program-inhibit and program-enable bit line voltages during the program pulses.

For example, a control circuit such as a programming circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

The controller 122 or control circuitry 110 can be configured with hardware, firmware and/or software for implementing the techniques described herein.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure. In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
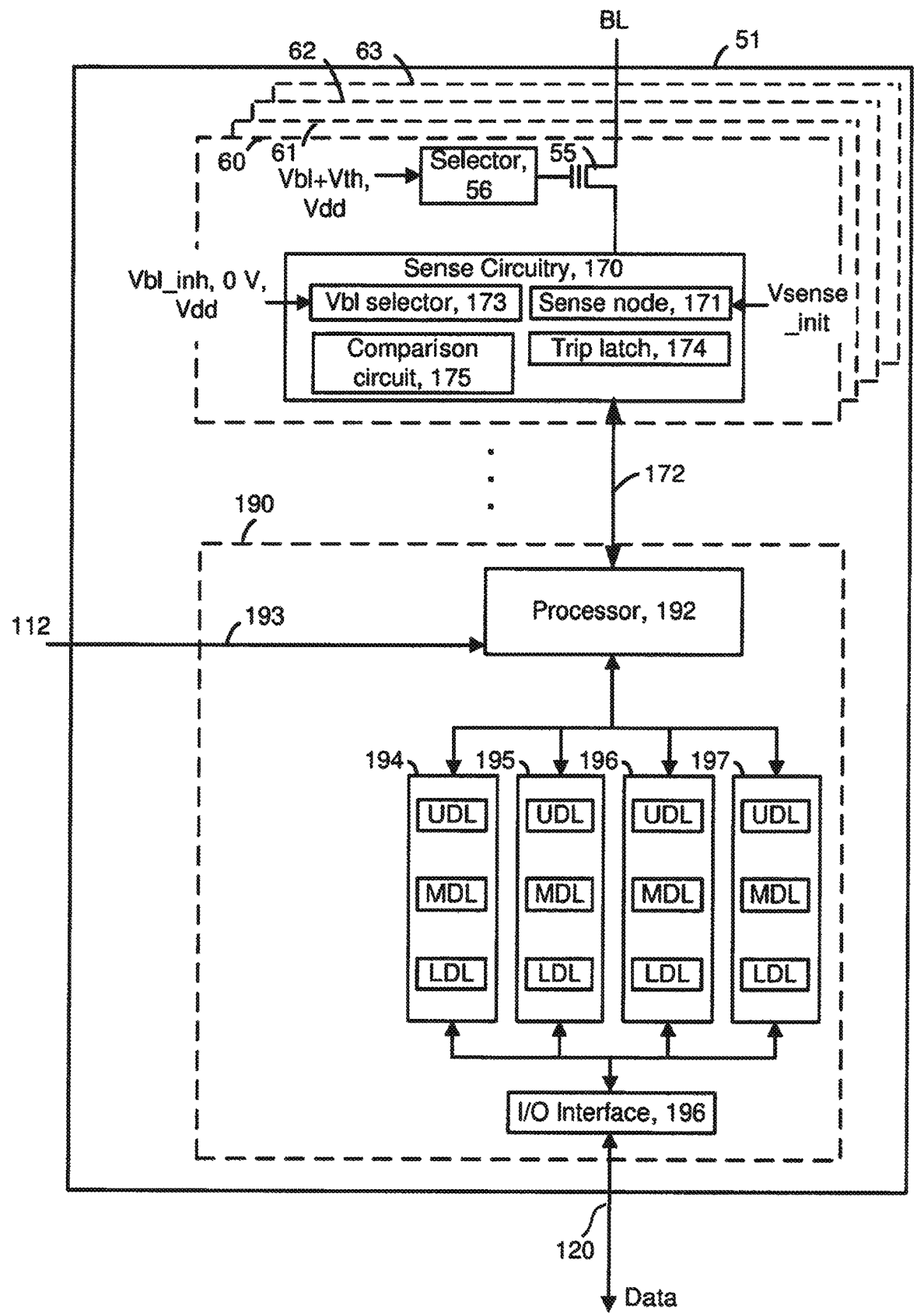
FIG. 2 is a block diagram depicting one embodiment of a sense block of FIG. 1 according to aspects of the disclosure.

FIG. 2 is a block diagram depicting one embodiment of the sense block 51 of FIG. 1. An individual sense block 51 is partitioned into one or more core portions, referred to as sense circuits 60-63 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements (memory cells).

The sense circuit 60, as an example, comprises sense circuitry 170 that performs sensing by determining whether a conduction current in a connected bit line is above or below a predetermined threshold level. The sensing can occur in a read or verify operation. The sense circuit also supplies a bit line voltage during the application of a program voltage in a program operation.

The sense circuitry may include a Vbl selector 173, a sense node 171, a comparison circuit 175 and a trip latch 174. During the application of a program voltage, the Vbl selector 173 can pass a program-inhibit voltage Vbl_inh (e.g., 2 V) to a bit line connected to a memory cell which is inhibited from programmed, or a program-enable voltage, e.g., 0 V, to a bit line connected to a memory cell which is being programmed in the current program loop. A transistor 55 (e.g., an nMOS) can be configured as a pass gate to pass Vbl from the Vbl selector 173, by setting the control gate voltage of the transistor sufficiently high, e.g., higher than the Vbl passed from the Vbl selector. For example, a selector 56 may pass a power supply voltage Vdd, e.g., 3-4 V to the control gate of the transistor 55.

During sensing operations such as read and verify operations, the bit line voltage is set by the transistor 55 based on the voltage passed by the selector 56. The bit line voltage is roughly equal to the control gate voltage of the transistor minus its Vth (e.g., 1 V). For example, if Vbl+Vth is passed by the selector 56, the bit line voltage will be Vbl. This assumes the source line is at 0 V. The transistor 55 clamps the bit line voltage according to the control gate voltage and acts a source-follower rather than a pass gate. The Vbl selector 173 may pass a relatively high voltage such as Vdd which is higher than the control gate voltage on the transistor 55 to provide the source-follower mode. During sensing, the transistor 55 thus charges up the bit line.

In one approach, the selector 56 of each sense circuit can be controlled separately from the selectors of other sense circuits, to pass Vbl or Vdd. The Vbl selector 173 of each sense circuit can also be controlled separately from the Vbl selectors of other sense circuits.

During sensing, the sense node 171 is charged up to an initial voltage such as Vsense_init=3 V. The sense node is then connected to the bit line via the transistor 55, and an amount of decay of the sense node is used to determine whether a memory cell is in a conductive or non-conductive state. The comparison circuit 175 is used to compare the sense node voltage to a trip voltage at a sense time. For example, in a program operation, if the sense node voltage decays below the trip voltage Vtrip, the memory cell is in a conductive state and its Vth is at or below the program-verify voltage and has not completed being programmed (the program-verify test is not passed). If the sense node voltage does not decay below Vtrip, the memory cell is in a non-conductive state and its Vth is above the program-verify voltage and has completed being programmed (the program-verify test is passed). The sense circuit 60 includes a trip latch 174 that is set by the comparison circuit 175 based on whether the memory cell is in a conductive or non-conductive state. The data in the trip latch can be a bit which is read out by the processor 192.

During an erase-verify test of an erase operation, an amount of decay of the sense node is used to determine whether a NAND strings is in a conductive or non-conductive state. If the sense node voltage decays below the trip voltage Vtrip, the NAND string is in a conductive state and its Vth is at or below the erase-verify voltage and has completed being erased, e.g., the erase-verify test is passed. If all, or nearly all of the NAND strings in a sub-block have completed being erased, the sub-block is also considered to have completed being erased and is inhibited from being further erased in a subsequent erase loop of the erase operation.

If the sense node voltage does not decay below Vtrip, the NAND string is in a non-conductive state and its Vth is above the erase-verify voltage and has not completed being erased, e.g., the erase-verify test is not passed. If a significant number of the NAND strings in a sub-block have not completed being erased, such as more than 1-5% of the NAND strings, the sub-block is also considered to not have completed being erased and is further erased in a subsequent erase loop of the erase operation.

The managing circuit 190 comprises a processor 192, four example sets of data latches 194-197 and an I/O Interface 196 coupled between the set of data latches 194 and data bus 120. One set of data latches, e.g., comprising individual latches LDL, MDL and UDL, can be provided for each sense circuit. In some cases, additional data latches may be used. LDL stores a bit for a lower page of data, MDL stores a bit for a lower page of data, and UDL stores a bit for an upper page of data. This is in an eight-level or three-bits per memory cell memory device.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120, in the LDL, MDL and UDL latches, in a three-bit per memory cells implementation.

The program operation, under the control of the state machine, applies a set of programming voltage pulses to the control gates of the addressed memory cells. Each voltage pulse may be stepped up in magnitude from a previous program pulse by a step size in a process referred to as incremental step pulse programming Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. An MDL or UDL latch is flipped when a middle or upper page bit, respectively, is stored in an associated memory cell. This occurs when an associated memory cell completes programming.

Figure 3:
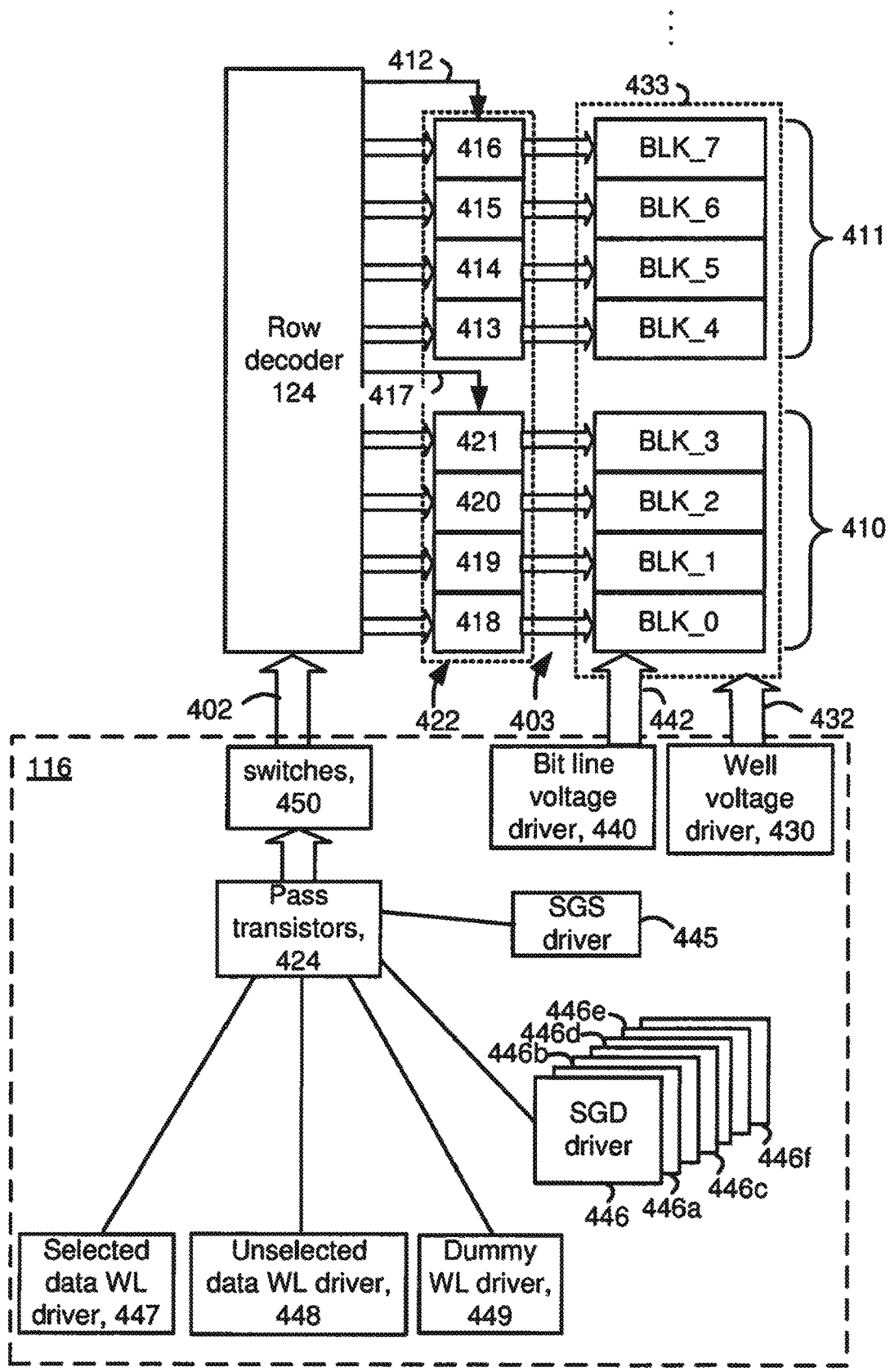
FIG. 3 depicts an example implementation of the power control module of FIG. 1 for providing voltages to blocks of memory cells according to aspects of the disclosure.

FIG. 3 depicts an example implementation of the power control module 116 of FIG. 1 for providing voltages to blocks of memory cells. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1 provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on (conductive), a voltage from the row decoder is provided to the respective control gate lines or word lines. If the pass transistors are off (non-conductive), the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively.

Typically, program or read operations are performed on one selected block at a time and on one selected sub-block of the block. An erase operation is typically performed initially on an entire block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

Figures 5A, 5B:
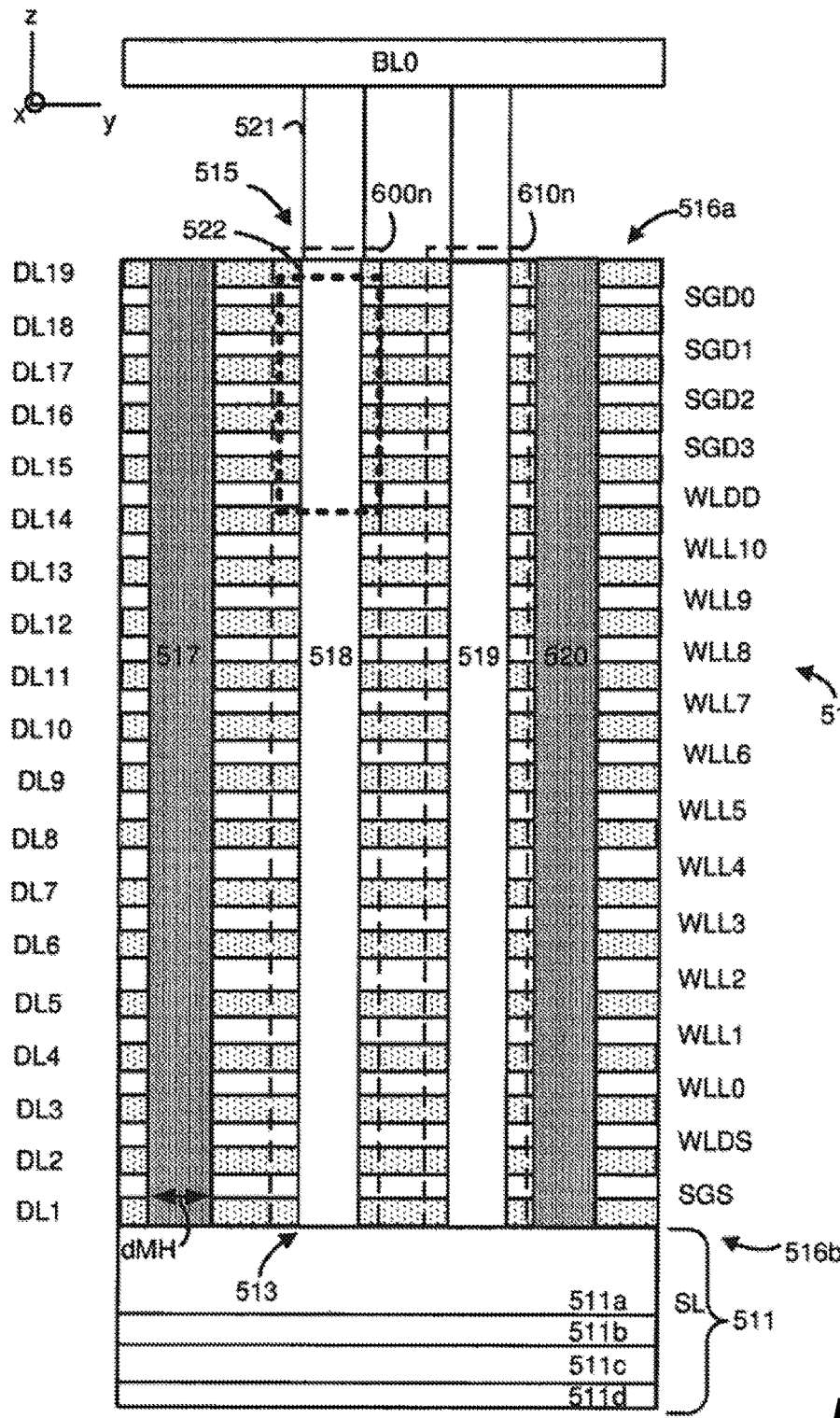
FIG. 5A depicts an example cross-sectional view of a portion of the block of FIG. 4 according to aspects of the disclosure.
FIG. 5B depicts an example transistor in the block of FIG. 4 according to aspects of the disclosure.

The voltage drivers can include a selected data word line (WL) driver 447, which provides a voltage on a data word line selected during a program or read operation, a driver 448 for unselected data word lines, and a driver for dummy word lines 449 (e.g., WLDS0, WLDD1, WLDS1 and WLDS0, respectively, in FIG. 5A).

The voltage drivers can also include an SGS driver 445 for a block, and separate SGD drivers 446-446f for sub-blocks SB0-SB6, respectively. In another example, there is one SGD driver shared by each sub-block, and another SGD driver specific to each sub-block.

In some cases, there can be multiple SGD transistors, multiple SGS transistors, multiple drain side dummy memory cells and/or multiple source side dummy memory cells in each NAND string. To provide the greatest flexibility in programming these memory cells and transistors with program voltages or other word line specific parameters, there can be a separate driver for each select gate transistor and dummy memory cell in a NAND string, in one approach.

The various components, including the row decoder, may receive commands from a controller such as the state machine 112 or the controller 122 to perform the functions described herein.

Figure 4:
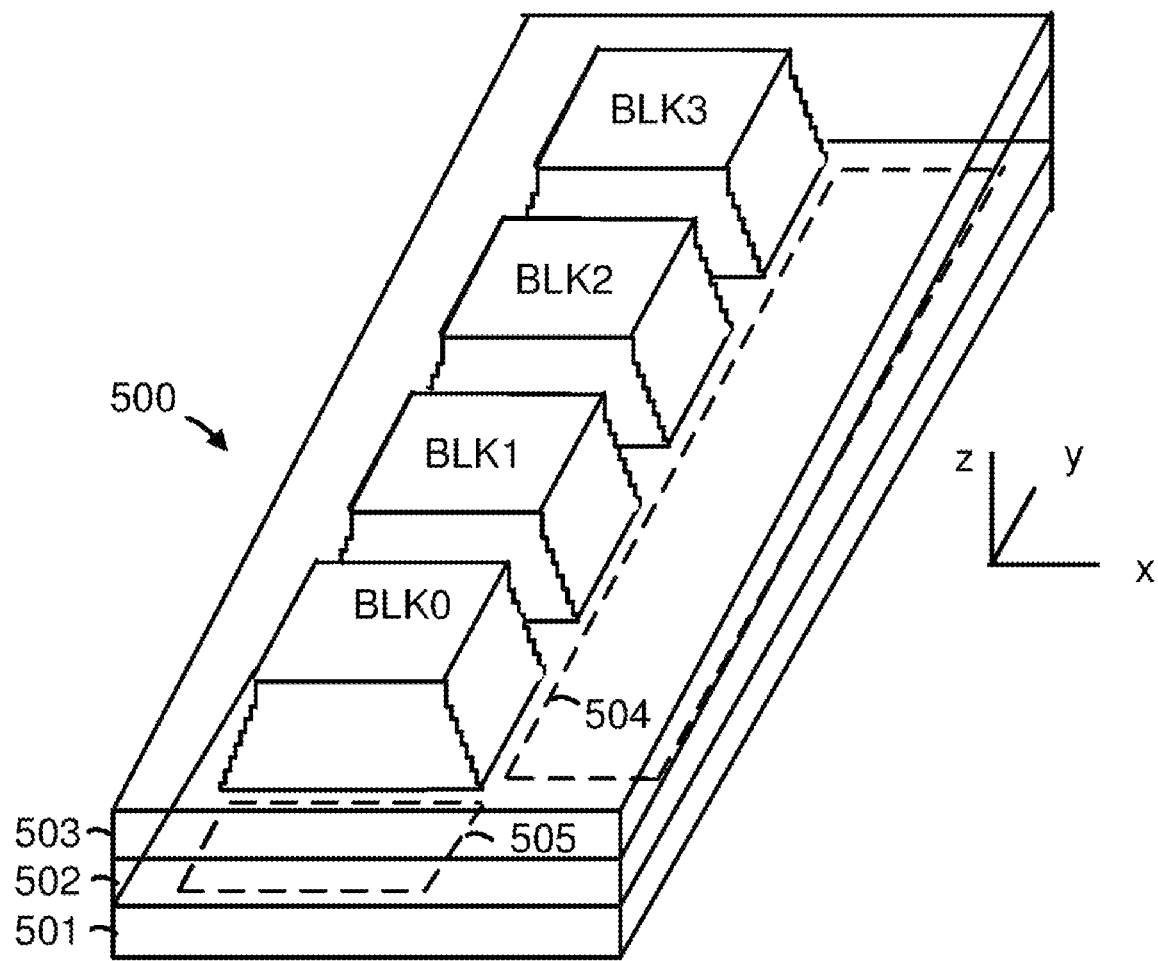
FIG. 4 is a perspective view of a memory device comprising a set of blocks in an example 3D configuration of the memory structure of FIG. 1 according to aspects of the disclosure.

In one approach, the well region 433 is common to the blocks and may be driven by a voltage driver 430 via a path 432. A set of bit lines 442 is also shared by the blocks. A bit line voltage driver 440 provides voltages to the bit lines. In a stacked memory device such as depicted in FIGS. 4 to 6, sets of connected memory cells may be arranged in NAND strings which extend vertically upward from the substrate. The bottom (or source end) of each NAND string is in contact with the well region, and the top end (or drain end) of each NAND string is connected to a respective bit line, in one approach.

FIG. 4 is a perspective view of a memory device 500 comprising a set of blocks in an example 3D configuration of the memory structure 126 of FIG. 1. On the substrate 501 are example blocks BLK0, BLK1, BLK2 and BLK3 of memory cells and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

FIG. 5A depicts an example cross-sectional view of a portion of the block BLK0 of FIG. 4. The block comprises a stack 516 of alternating conductive layers (e.g., word lines or control gate lines) and dielectric layers. In this example, the conductive layers comprise first through four SGD layers, SGD0-SGD3, respectively. The conductive layers also include one SGS layer, one source side dummy word line layer WLDS, one drain side dummy word line layer WLDD, and eleven data word line layers (or data word lines) WLL0-WLL10. WLL0 is a source side data word line and WLL10 is a drain side data word line. The dielectric layers are labelled as DL1-DL19. Further, regions of the stack which comprise NAND strings 600n and 610n are depicted. Each NAND string encompasses a memory hole 518 or 519 which is filled with materials which form memory cells adjacent to the word lines. Region 522 of the stack is shown in greater detail in FIG. 6.

The stack includes a substrate 511. In one approach, a portion of the source line SL comprises a well region 511a as an n-type source diffusion layer or well in the substrate. The well region is in contact with a source end of each string of memory cells in a block. An erase pulse may be applied to this layer in an erase operation The n-type well region 511a is formed in a p-type well region 511b, which in turn is formed in an n-type well region 511c, which in turn is formed in a p-type semiconductor substrate 511d, in one possible implementation. The n-type source diffusion layer may be shared by all of the blocks in a plane, in one approach.

NAND string 600n has a source-end 513 at a bottom 516b of the stack 516 and a drain-end 515 at a top 516a of the stack. Metal-filled slits 517 and 520 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 521 connects the drain-end 515 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

A memory hole diameter, dMH, is also depicted. See FIG. 5C for further details.

FIG. 5B depicts an example transistor 549 in BLK0 in FIG. 4. The transistor comprises a control gate CG, a drain D, a source S and a channel CH and may represent a memory cell or a select gate transistor, for example.

Figure 5C:
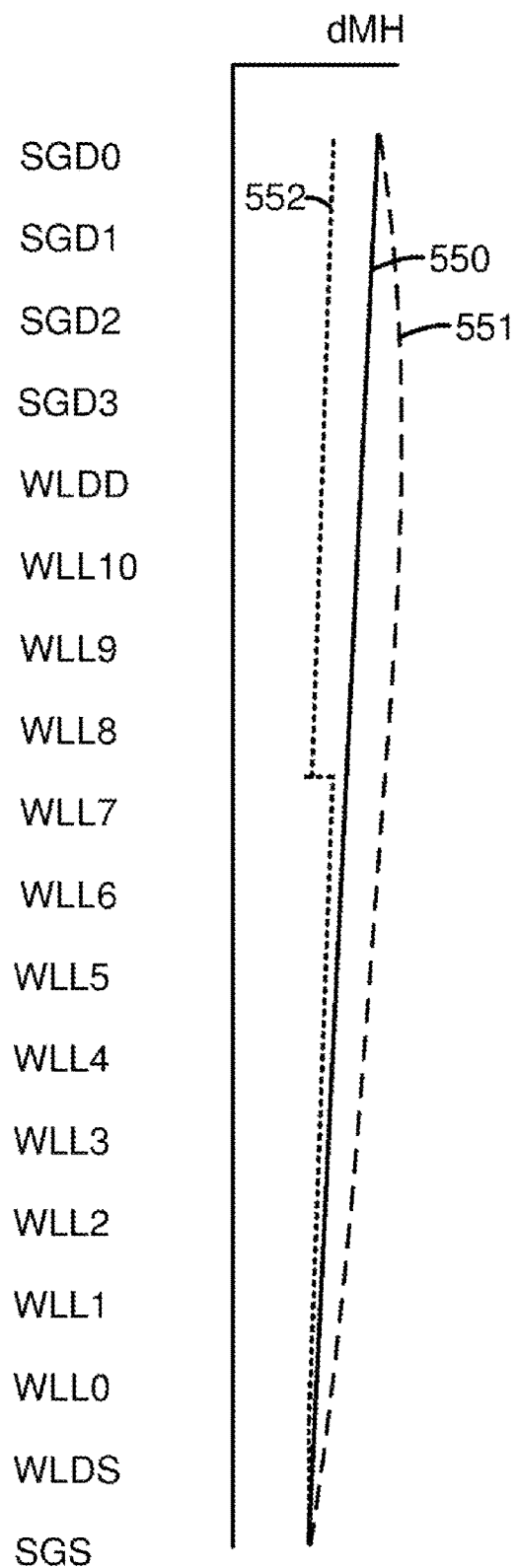
FIG. 5C depicts a plot of memory hole diameter in the stack of FIG. 5A according to aspects of the disclosure.
Figure 6:
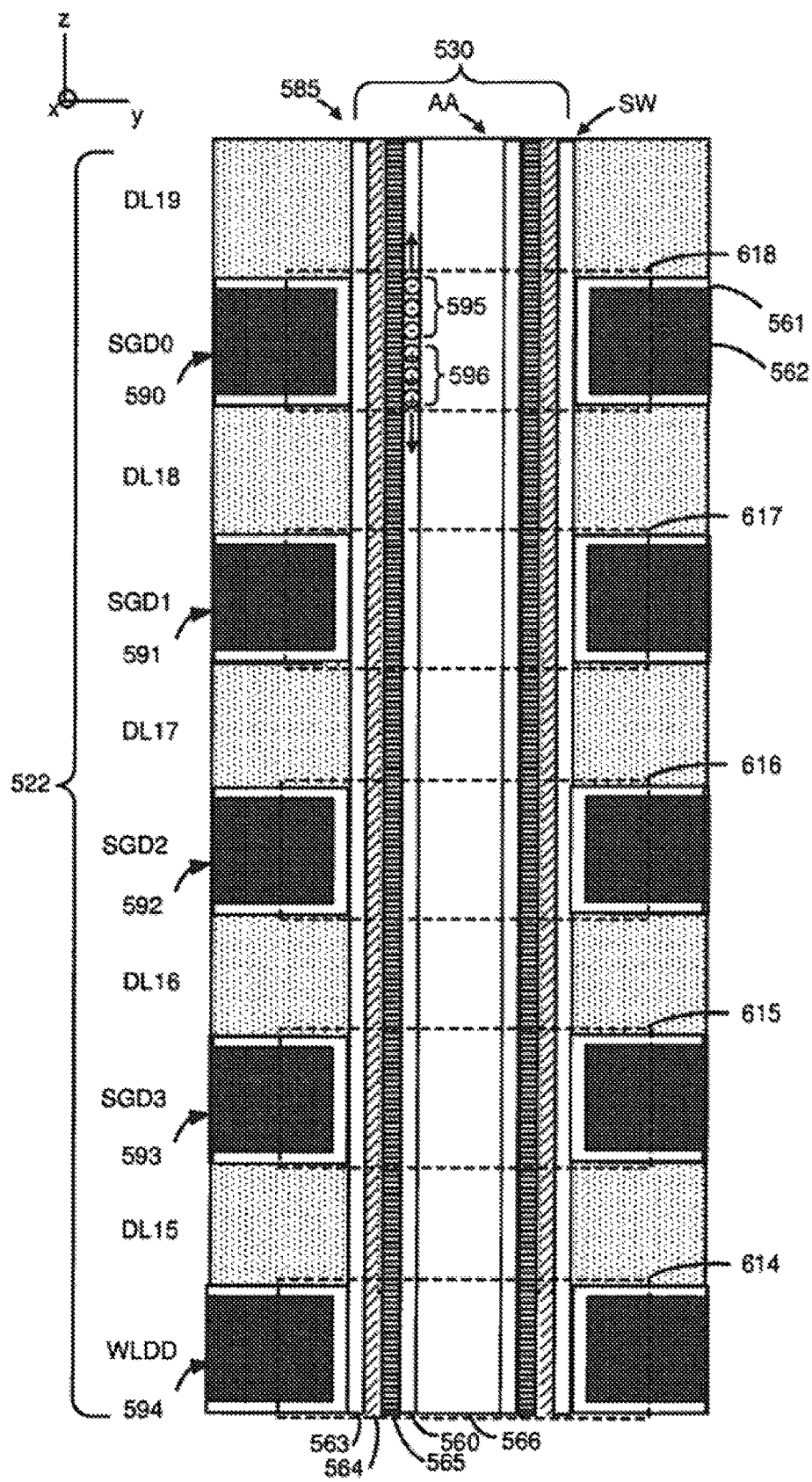
FIG. 6 depicts a close-up view of a region of the stack of FIG. 5A according to aspects of the disclosure.

FIG. 5C depicts a plot of memory hole diameter in the stack of FIG. 5A. The vertical axis depicts a diameter dMH of the memory holes and the pillars formed by materials in the memory holes. In such a memory device, the memory holes which are etched through the stack have a very high aspect ratio. For example, a depth-to-diameter ratio of about 25-30 is common. The memory holes may have a circular cross-section. Due to the etching process, the memory hole and resulting pillar width can vary along the length of the hole. Typically, the diameter becomes progressively smaller from the top to the bottom of the memory hole (plot 550). That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole (plot 551).

Due to the non-uniformity in the diameter of the memory hole and pillar, the programming and erase speed of the memory cells can vary based on their position along the memory hole. With a relatively smaller diameter portion of a memory hole, the electric field across the tunnel oxide is relatively stronger, so that the programming and erase speed is higher. This variation is in addition to the variation caused by different thicknesses of the blocking oxide layer.

In another possible implementation, represented by plot 552, the stack is fabricated in two tiers. The stack can be fabricated in two or more tiers. The bottom tier is formed first with a respective memory hole. The top tier is then formed with a respective memory hole which is aligned with the memory hole in the bottom tier. Each memory hole is tapered such that a double tapered memory hole is formed in which the width increases, then decreases and increases again, moving from the bottom of the stack to the top.

FIG. 6 depicts a close-up view of the region 522 of the stack of FIG. 5A. Select gate transistors and memory cells are formed at the different levels of the stack at the intersection of a word line layer and a memory hole. In this example, SGD transistors 615-618 are formed above a dummy memory cell 614 at the drain end of the NAND string.

A number of layers can be deposited along the sidewall (SW) of the memory hole 530 and/or within each word line layer, e.g., using atomic layer deposition. For example, each pillar 585 or column which is formed by the materials within a memory hole can include a blocking oxide layer 563 (e.g., comprising $SiO_2$), a charge-trapping layer 564 or film (e.g., comprising silicon nitride, $Si_3N_4$, or other nitride), a tunneling layer 565 (e.g., comprising a gate oxide), a channel 560 (e.g., comprising polysilicon), and a dielectric core 566 (e.g., comprising $SiO_2$). A word line layer can include a metal barrier 561 and a conductive metal 562 such as Tungsten as a control gate. For example, control gates 590-594 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string or set of connected transistors comprises a channel which extends continuously from one or more source-end select gate transistors to one or more drain-end select gate transistors. The channels are continuous in that they are uninterrupted and can therefore provide a continuous conductive path in the NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge.

During an erase operation, the electrons return to the channel. Also during an erase operation, the channel of a NAND string may be charged, e.g., its voltage increased, by generating holes in the channel. In one approach, the topmost or first SGD transistor is used to generate electron-hole pairs using GIDL. The electrons 595 move upward in the channel in the direction of the positive erase voltage at the bit line and the drain end of the NAND string, while the holes 596 move downward in the channel toward the source end of the NAND string. The holes become distributed in the channel adjacent to the memory cells so that a high positive channel-to-gate voltage can be obtained to erase the memory cells.

Figure 7:
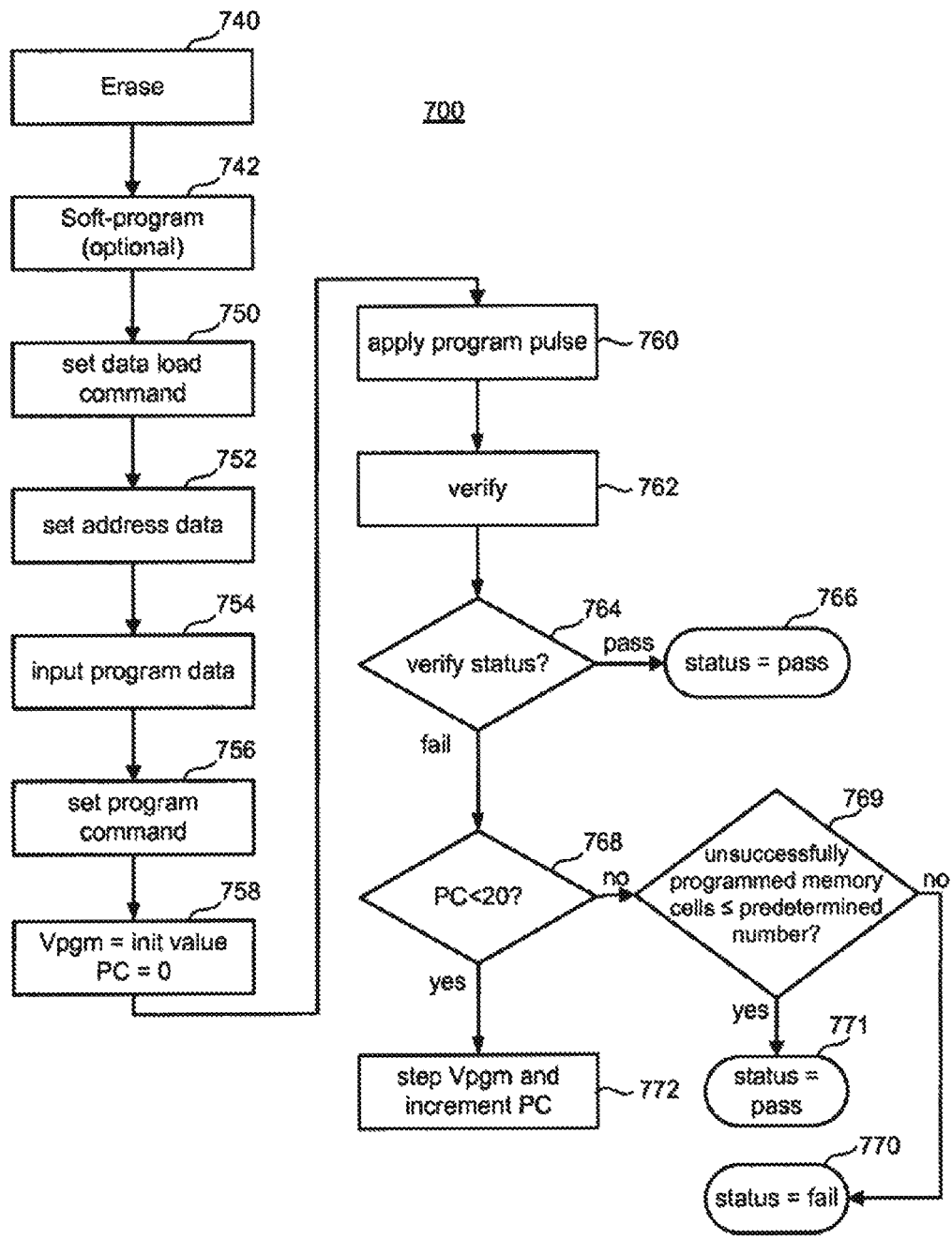
FIG. 7 is a flow chart describing one embodiment of a method for programming non-volatile memory according to aspects of the disclosure.

FIG. 7 is a flow chart describing one embodiment of a method 700 for programming non-volatile memory. The memory cells to be programmed are erased at step 740. Step 740 can include erasing more memory cells than those to be programmed (e.g., in blocks or other units). At optional step 742, soft programming is performed to narrow the distribution of erased threshold voltages for the erased memory cells. Some memory cells may be in a deeper erased state than necessary as a result of the erase process. Soft programming can apply small programming pulses to move the threshold voltage of the erased memory cells closer to the erase verify level. At step 750 of FIG. 7, a "data load"

command is issued by controller 544 and input to control circuitry 520, allowing data to be input to a data input/output buffer. At step 752, address data designating the page address is input to row controller or decoder 540 from the controller or host. The input data is recognized as the page address and latched via state machine 522. At step 754, a page of program data for the addressed page is input to data input/output buffer for programming. For example, 532 bytes of data could be input in one embodiment. That data is latched in the appropriate registers for the selected bit lines. In some embodiments, the data is also latched in a second register for the selected bit lines to be used for verify operations. At step 756, a "program" command is issued by the controller and input to data input/output buffer. The command is latched by state machine 316 via the command latch signal input to command circuits.

Triggered by the "program" command, the data latched in step 754 will be programmed into the selected memory cells controlled by state machine 522 using stepped pulses applied to the appropriate word line. At step 758, VPGM, the programming pulse voltage level applied to the selected word line, is initialized to the starting pulse (e.g., 12V) and a program counter PC maintained by state machine 522 is initialized at 0. At step 760, the first VPGM pulse is applied to the selected word line. If logic "0" is stored in a particular data latch indicating that the corresponding memory cell should be programmed, then the corresponding bit line is grounded. On the other hand, if logic "1" is stored in the particular latch indicating that the corresponding memory cell should remain in its current data state, then the corresponding bit line is connected to Vdd to inhibit programming.

At step 762, the states of the selected memory cells are verified. If it is detected that the target threshold voltage of a selected cell has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine knows that all selected cells have been programmed. At step 764, it is checked whether all of the data latches are storing logic "1." If so, the programming process is complete and successful because all selected memory cells were programmed and verified to their target states. A status of "PASS" is reported at step 766.

If, at step 764, it is determined that not all of the data latches are storing logic "1," then the programming process continues. At step 768, the program counter PC is checked against a program limit value. One example of a program limit value is 20; however, other values can be used in various implementations. If the program counter PC is not less than 20, then it is determined at step 769 whether the number of bits that have not been successfully programmed is equal to or less than a predetermined number. If the number of unsuccessfully programmed bits is equal to or less than the predetermined number, then the programming process is flagged as passed and a status of pass is reported at step 771. The bits that are not successfully programmed can be corrected using error correction during the read process. If however, the number of unsuccessfully programmed bits is greater than the predetermined number, then program process is flagged as failed and a status of fail is reported at step 770. If the program counter PC is less than 20, then the VPGM level is increased by the step size and the program counter PC is incremented at step 772. After step 772, the process loops back to step 760 to apply the next VPGM pulse.

The flowchart of FIG. 7 depicts a single-pass programming method as can be applied for binary storage. In a two-pass programming method as can be applied for multi-level storage, for example, multiple programming or verification steps may be used in a single iteration of the flowchart. Steps 758-772 may be performed for each pass of the programming operation. In a first pass, one or more program pulses may be applied and the results thereof verified to determine if a cell is in the appropriate intermediate state. In a second pass, one or more program pulses may be applied and the results thereof verified to determine if the cell is in the appropriate final state.

Figure 8:
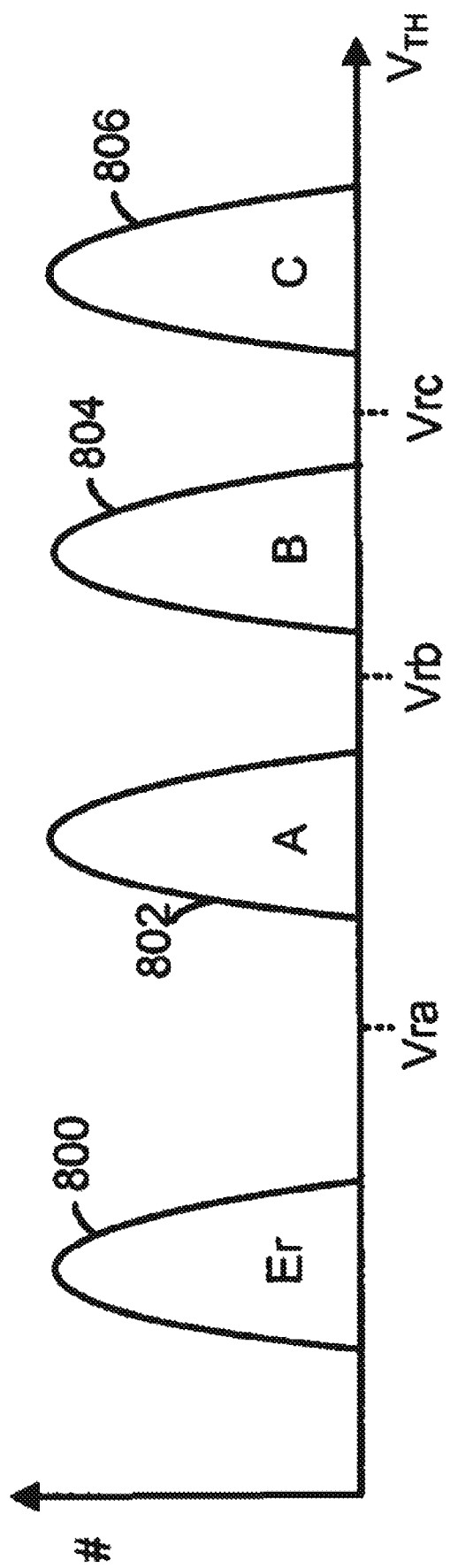
FIG. 8 depicts an example set of threshold voltage distributions according to aspects of the disclosure.

At the end of a successful program process, the threshold voltages of the memory cells should be within one or more distributions of threshold voltages for programmed memory cells or within a distribution of threshold voltages for erased memory cells. FIG. 8 illustrates exemplary threshold voltage distributions for a memory cell array when each memory cell stores two bits of data in four physical states. Distribution 800 represents a distribution of threshold voltages of cells that are in an erased state (storing "11"), which may have negative threshold voltage levels. Distribution 802 represents a distribution of threshold voltages of cells that are in a first programmed state, storing "10." Distribution 804 represents a distribution of threshold voltages of cells that are in a second programmed state, storing "00." Distribution 806 represents a distribution of threshold voltages of cells that are in a third programmed state, storing "01."

Of course, if the memory is operated with more than four physical states then there will be a number of threshold voltage distributions within the defined voltage threshold window of the memory cells that is equal to the number of states. Further, although specific bit patterns have been assigned to each of the distributions or physical states, different bit patterns may be assigned.

Figure 9:
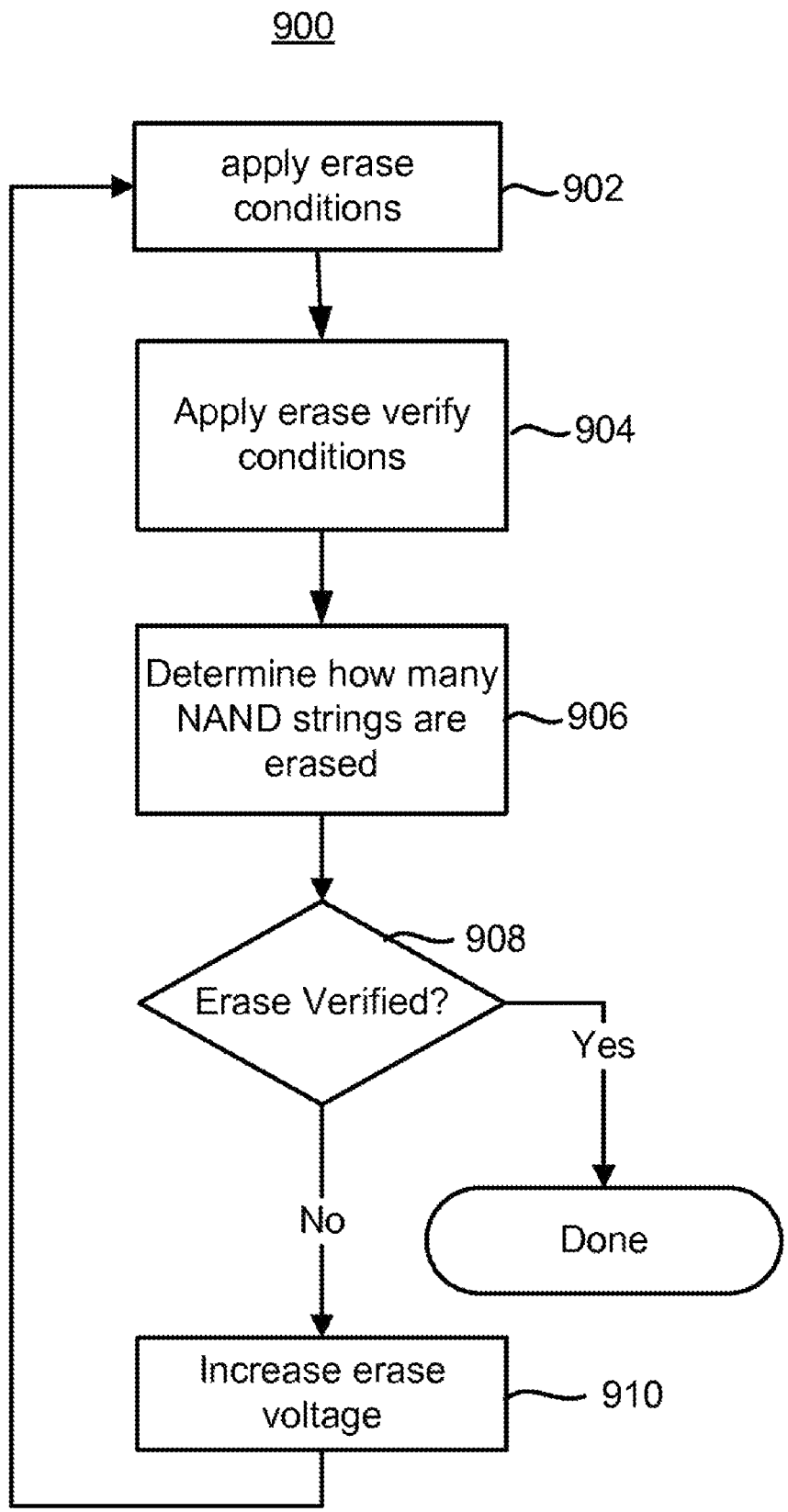
FIG. 9 is a flow chart describing a process for erasing memory cells according to aspects of the disclosure.

FIG. 9 is a flow chart describing a conventional process 900 for erasing memory cells. In step 902, erase conditions are applied to the memory cells. In one embodiment, the erase is achieved by raising the p-well to an erase voltage for a sufficient period of time and grounding the word lines of a selected block while the source and bit lines are floating. Due to capacitive coupling, the unselected word lines, bit lines, select lines, and the common source line are also raised to a significant fraction of the erase voltage. A strong electric field is thus applied to the tunnel oxide layers of selected memory cells and the data of the selected memory cells are erased as electrons of the floating gates are emitted to the substrate side, typically by Fowler-Nordheim tunneling mechanism. As electrons are transferred from the floating gate to the p-well region, the $V_{TH}$ of a selected cell is lowered. Erasing can be performed on the entire memory array, on individual blocks, or another unit of cells.

In another approach, the memory device includes NAND strings which have a drain-side select gate (SGD) transistor on one end and a source-side select gate (SGS) transistor on the other end (see FIG. 5A). The erase may be a "one-sided erase" or a "two-sided erase." When an erase voltage is applied to the bit line in a one-sided erase, or to the bit line and source line in a two-sided erase, the select gate transistors generate a sufficient amount of gate-induced drain leakage (GIDL) current to charge up the floating body (channel) of the NAND string. GIDL increases in proportion to the drain-to-gate voltage (Vdg) of the select gate transistors.

In step 904, a set of erase verify conditions are applied to the memory cells. The target $V_{TH}$ could be positive or negative. In some embodiments, sensing for a positive $V_{TH}$ involves applying a positive reference voltage to word lines and determining whether the NAND string conducts a current in response.

In one implementation, source follower sensing is employed for sensing for a negative $V_{TH}$. Step 904 may include discharging bit lines to ground, which may be achieved by turning on the drain side select gate (SGD). Then, a higher than zero voltage (e.g., 2.2V) is applied to the common source line and a certain voltage (e.g., 0V) is applied to the word lines. Charge builds up on the bit line of a given NAND string until the body effect turns off at least one memory cell in the NAND string. However, other sensing techniques can be used.

In step 906, each of the NAND strings is sensed to determine whether all of the memory cells on the NAND string were sufficiently erased. Step 906 is performed after waiting for a predetermined period of time for the charge to build up on the bit line, in one embodiment. In one implementation, the voltage on a given bit line is compared to a reference value to determine whether any of the memory cells on the corresponding NAND string have a $V_{TH}$ that is above the target value. The target value could be a negative value. In some implementations, the memory cells are erased to as much as −3V.

In one embodiment, if it is detected that the $V_{TH}$ of each memory cell on a NAND string has reached the target level, then the data stored in the corresponding data latch is changed to a logic "1." If it is detected that the NAND string has at least one memory cell with a $V_{TH}$ that has not reached the appropriate target level, the data stored in the corresponding data latch is not changed.

In step 908, a determination is made as to whether enough NAND strings passed erase verification. In one implementation, a certain number of NAND strings are allowed to fail erase verification. For example, providing that fewer than 32 NAND strings failed erase verification, the overall erase verification passes. If erase passed, then the process concludes.

If, at step 908, it is determined that erase verification failed, then the erase voltage is increased in step 910. The erase voltage can be increased by any desired amount such as 0.2 V, 0.5 V, 1.0 V, etc. The new erase voltage is applied in step 902.

Figure 10A:
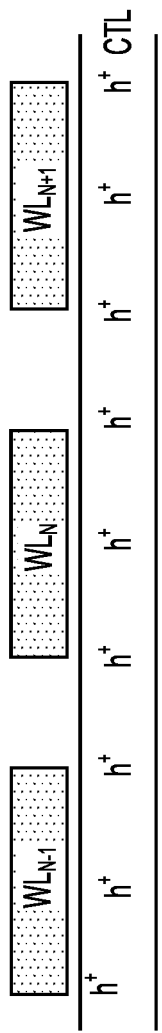
FIGS. 10A-10C show charge profiles of a portion of a memory hole following a normal erase operation, a stripe erase operation, and after cycling using the stripe erase operation according to aspects of the disclosure.
Figure 10B:
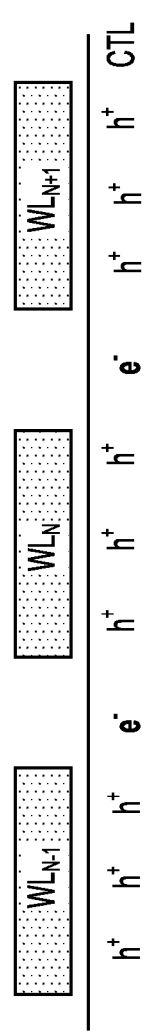
Figure 10C:
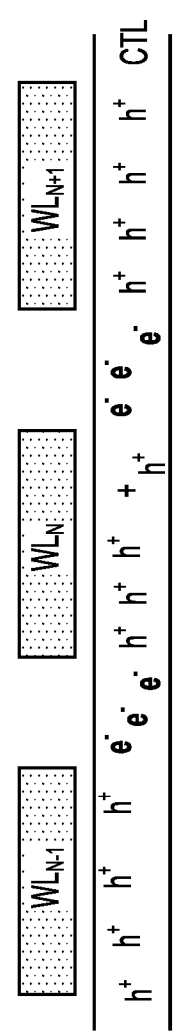

As discussed above, the use of stripe erase operations, followed by cycling, may cause electrons to accumulate in a parasitic region (i.e., region in a charge-trapping layer between adjacent word lines) of the charge-trapping layer between word lines and make strings harder to erase. FIGS. 10A-10C show charge profiles of a portion of a memory hole following a normal erase operation, a stripe erase operation, and after cycling using the stripe erase operation. As shown, 3D NAND's charge trapping layer (CTL) (e.g., charge-trapping layer 564 of FIG. 6) is continuous in the same string. Lateral charge movement in the CTL after programming becomes a data retention (DR) issue. The traditional normal-erase method erases all word lines together. Holes are evenly distributed in CTL. The parasitic region's remaining holes increase the later charge movement and the lateral data retention (DR). So, in the charge profile after the normal erase operation (e.g., the erase operation of FIG. 9) shown in FIG. 10A, holes are evenly distributed in the charge-trapping layer, indicated as CTL. In comparison, the stripe erase method or operation reduces holes in the parasitic region by erasing even word lines and odd word lines separately. Such a technique successfully reduces lateral data retention. As shown in FIG. 10B, holes are localized beneath the word lines of the charge profile after the stripe erase operation, while some electrons may remain in the parasitic region, which suppresses lateral data retention, because of fewer holes are in the parasitic region. However, after cycling, the parasitic region may accumulate electrons and increases vertical data retention. So, in the charge profile of after cycling with the stripe erase operation shown in FIG. 10C, after cycling using stripe erase, electrons start to accumulate in the parasitic region. The electrons accumulating in the parasitic region between word lines makes memory strings harder to erase and increases vertical retention. So, the charge profile shown in FIG. 10C makes the erase operation harder and increases vertical data retention.

Consequently, described herein is a memory apparatus (e.g., memory device 100 of FIG. 1) including memory cells (e.g., transistor or memory cell 549 of FIG. 5B) connected to one of a plurality of word lines (e.g., word lines WLL0-WLL10 of FIG. 5A). The memory cells are arranged in one or more strings (e.g., NAND strings 600n and 610n of FIG. 5A) and each is configured to retain a threshold voltage Vt or $V_{TH}$ corresponding to one of a plurality of memory states (e.g., Er, A, B, C, of FIG. 8). The apparatus also includes a control circuit (e.g., one or more of the components (alone or in combination), other than memory structure 126, of FIG. 1) coupled to the plurality of word lines and the strings. The control circuit is configured to determine whether the cycle count is less than the predetermined cycle count maximum threshold. The control circuit is configured to erase the memory cells using a stripe erase operation in response to determining a cycle count is less than a predetermined cycle count maximum threshold.

As discussed, the plurality of word lines and a plurality of dielectric layers overlay one another in an alternating fashion in a stack (e.g., stack 516 of FIG. 5A). The plurality of word lines include a plurality of even word lines (e.g., WLL0, WLL2, WLL4, WLL6, WLL8, WLL10 of FIG. 5A) comprising every other ones of the plurality of word lines and a plurality of odd word lines (e.g., WLL1, WLL3, WLL5, WLL7, WLL9 of FIG. 5A) each disposed between ones of the plurality of even word lines.

The control circuit is further configured to apply an erase voltage to each of the strings while simultaneously applying a word line erase voltage (e.g., 0 volts or 0.5 volts) to the plurality of even word lines associated with a selected block to encourage erasing of the memory cells corresponding with the plurality of even word lines and applying a word line inhibit voltage to the plurality of odd word lines associated with the selected block to discourage erasing of the memory cells corresponding with the plurality of odd word lines during the stripe erase operation. The control circuit is additionally configured to apply the erase voltage to each of the strings while simultaneously applying the word line erase voltage to the plurality of odd word lines associated with the selected block to encourage erasing of the memory cells corresponding with the plurality of odd word lines and applying the word line inhibit voltage to the plurality of even word lines associated with the selected block to discourage erasing of the memory cells corresponding with the plurality of even word lines during the stripe erase operation.

The control circuit is also configured to program the memory cells during a program operation (see e.g., FIG. 7) following erasing the memory cells using the stripe erase operation in response to determining the cycle count is less than the predetermined cycle count maximum threshold.

The control circuit then increments the cycle count and returns to determine whether the cycle count is less than the predetermined cycle count maximum threshold.

The control circuit is also configured to perform a dummy cycle operation in response to determining the cycle count is not less than the predetermined cycle count maximum threshold (e.g., 30). According to an aspect, the dummy cycle operation includes a normal erase operation (e.g., the erase operation of FIG. 9) followed by a manual block write operation. So, the control circuit is further configured to apply the erase voltage to each of the strings while simultaneously applying the word line erase voltage (e.g., 0 volts or 0.5 volts) to both the plurality of odd word lines and the plurality of even word lines associated with the selected block to encourage erasing of the memory cells corresponding with both the plurality of odd word lines and the plurality of even word lines during the normal erase operation. The control circuit is also configured to apply a manual write voltage to both the plurality of odd word lines and the plurality of even word lines associated with the selected block to raise the threshold voltage Vt of the memory cells corresponding with both the plurality of odd word lines and the plurality of even word lines during the manual block write operation.

To reduce dummy cycle overhead, the normal erase can be shallow erase and the manual block write can be programming to a low threshold voltage Vt. Specifically, the erase voltage applied by the control circuit during the normal erase can be lower than the erase voltage applied by the control circuit during the stripe erase operation. Also, as discussed, the threshold voltage Vt possible for each of the memory cells spans a threshold window partitioned into a plurality of regions for the plurality of memory states including an erased state associated with one of the plurality of regions corresponding to the threshold voltage Vt being lower compared to others of the plurality of regions representing at least one programmed state. So, the manual write voltage applied by the control circuit during the manual block write is selected to minimally raise the threshold voltage Vt of the memory cells to one of a plurality of lower threshold voltages adjacent the erased state.

In addition, the control circuit is configured to erase the memory cells using the stripe erase operation following the normal erase operation and the manual block write in response to determining the cycle count is not less than the predetermined cycle count maximum threshold. The control circuit is also configured to program the memory cells during the program operation. Additionally, the control circuit is configured to set the cycle count to zero and return to determine whether the cycle count is less than the predetermined cycle count maximum threshold.

Referring back to FIG. 6, the memory cells comprise annular layers including a blocking oxide layer and a charge-trapping layer extending vertically through the stack. So, according to an aspect, the predetermined cycle count maximum threshold is selected based on at least one of an erase depth of the stripe erase operation (depth of the erase varied according to the erase voltage applied to the strings, for example) and characteristics of the annular layers (i.e., MANOS processes). The blocking oxide layer separates the charge-trapping layer from the each of the plurality of word lines to block charges in the charge-trapping layer from reaching each of the plurality of word lines. As discussed, a parasitic region is defined in the charge-trapping layer vertically between adjacent ones of the plurality of word lines and horizontally aligned with each of the plurality of dielectric layers of the stack. Thus, the control circuit is further configured to reduce accumulation of electrons in the parasitic region (e.g., using the dummy cycle operation described above). According to an aspect, all of the above described function of the control circuit, including the dummy cycle operation, can be can be a system level background operation to avoid a program time Tprog or erase time Terase penalty.

Figure 11:
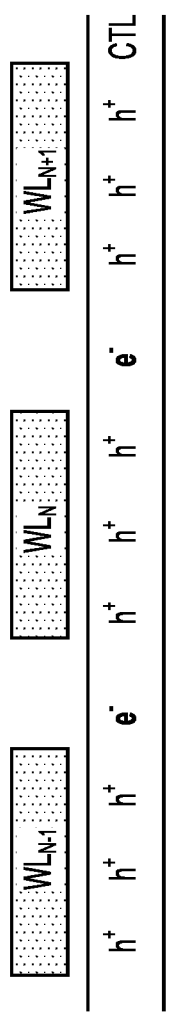
FIG. 11 shows a charge profile of the portion of the memory hole shown in FIGS. 10A-10C after periodically applying a dummy cycle according to aspects of the disclosure.

FIG. 11 shows a charge profile of the portion of the memory hole shown in FIGS. 10A-10C after periodically applying a dummy cycle. As shown, the normal erase reduces the accumulated electrons in the parasitic region and reduce vertical data retention. Thus, adding the dummy cycle using normal erase periodically (period based on the predetermined cycle count maximum threshold) to clear out accumulated electrons in the parasitic region improves stripe erase endurance and data retention.

Figure 12:
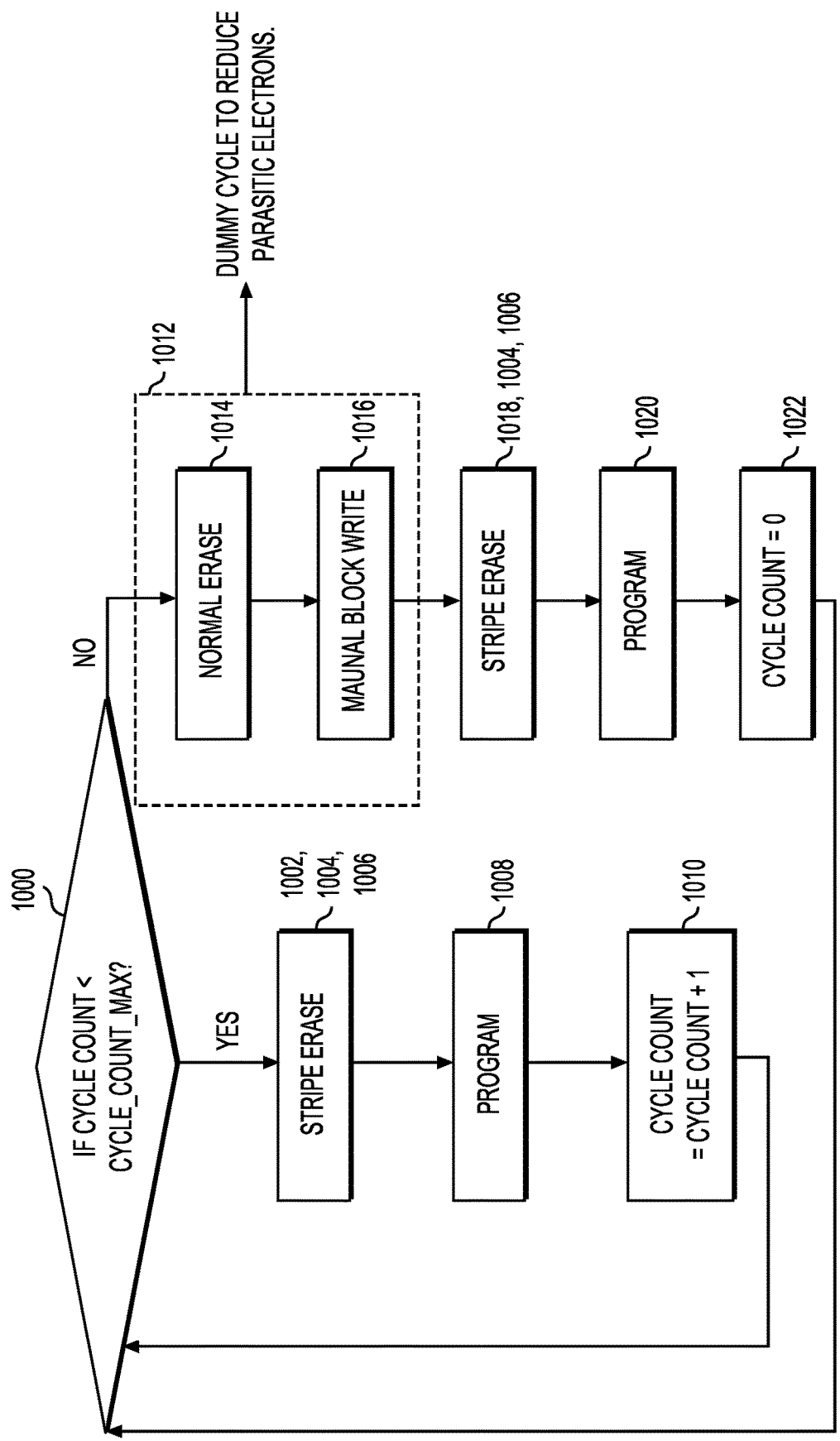
FIG. 12 illustrates steps of a method of operating a memory apparatus according to aspects of the disclosure.

Now referring to FIG. 12, a method of operating a memory apparatus is also provided. As discussed above, the memory apparatus (e.g., memory device 100 of FIG. 1) includes memory cells (e.g., transistor or memory cell 549 of FIG. 5B) connected to one of the plurality of word lines (e.g., word lines WLL0-WLL10 of FIG. 5A). The memory cells are arranged in strings (e.g., NAND strings 600$n$ and 610$n$ of FIG. 5A) and configured to retain the threshold voltage Vt corresponding to one of a plurality of memory states (e.g., Er, A, B, C, of FIG. 8). The method includes the step of 1000 determining whether a cycle count is less than a predetermined cycle count maximum threshold. The method includes the step of 1002 erasing the memory cells using a stripe erase operation in response to determining the cycle count is less than the predetermined cycle count maximum threshold.

As discussed above, the plurality of word lines and a plurality of dielectric layers overlay one another in an alternating fashion in a stack (e.g., stack 516 of FIG. 5A), the plurality of word lines include a plurality of even word lines comprising every other ones of the plurality of word lines and a plurality of odd word lines each disposed between ones of the plurality of even word lines. So the stripe erase can include the step of 1004 applying an erase voltage to each of the strings while simultaneously applying a word line erase voltage to the plurality of even word lines associated with a selected block to encourage erasing of the memory cells corresponding with the plurality of even word lines and applying a word line inhibit voltage to the plurality of odd word lines associated with the selected block to discourage erasing of the memory cells corresponding with the plurality of odd word lines during the stripe erase operation. The stripe erase operation can also include the step of 1006 applying the erase voltage to each of the strings while simultaneously applying the word line erase voltage to the plurality of odd word lines associated with the selected block to encourage erasing of the memory cells corresponding with the plurality of odd word lines and applying the word line inhibit voltage to the plurality of even word lines associated with the selected block to discourage erasing of the memory cells corresponding with the plurality of even word lines during the stripe erase operation.

The method continues with the step of 1008 programming the memory cells during a program operation (see e.g., FIG. 7) following erasing the memory cells using the stripe erase operation in response to determining the cycle count is less than the predetermined cycle count maximum threshold. The method proceeds by 1010 incrementing the cycle count and returning to determine whether the cycle count is less than the predetermined cycle count maximum threshold.

The method also includes the step of 1012 performing a dummy cycle operation in response to determining the cycle count is not less than the predetermined cycle count maximum threshold. As discussed above, the dummy cycle operation includes a normal erase operation followed by a manual block write operation. Thus, the method further includes the step of 1014 applying the erase voltage to each of the strings while simultaneously applying the word line erase voltage to both the plurality of odd word lines and the plurality of even word lines associated with the selected block to encourage erasing of the memory cells corresponding with both the plurality of odd word lines and the plurality of even word lines during the normal erase operation. Again, according to an aspect, the erase voltage applied by the memory apparatus during the normal erase can be lower than the erase voltage applied by the memory apparatus during the stripe erase operation (i.e., the normal erase is a shallow erase). The method also includes the step of 1016 applying a manual write voltage to both the plurality of odd word lines and the plurality of even word lines associated with the selected block to raise the threshold voltage Vt of the memory cells corresponding with both the plurality of odd word lines and the plurality of even word lines during the manual block write operation. As discussed, the threshold voltage Vt possible for each of the memory cells spans a threshold window partitioned into a plurality of regions for the plurality of memory states. The plurality of memory states includes including the erased state associated with one of the plurality of regions corresponding to the threshold voltage Vt being lower compared to others of the plurality of regions representing at least one programmed state. Thus, according to an aspect, the manual write voltage applied by the memory apparatus during the manual block write is selected to minimally raise the threshold voltage Vt of the memory cells to one of a plurality of lower threshold voltages adjacent the erased state.

The method continues with the step of 1018 erasing the memory cells using the stripe erase operation (e.g., steps 1004, and 1006) following the normal erase operation and the manual block write in response to determining the cycle count is not less than the predetermined cycle count maximum threshold. The next step of the method is 1020 programming the memory cells during the program operation. The method continues with the step of 1022 setting the cycle count to zero and returning to determine whether the cycle count is less than the predetermined cycle count maximum threshold.

Figure 13A:
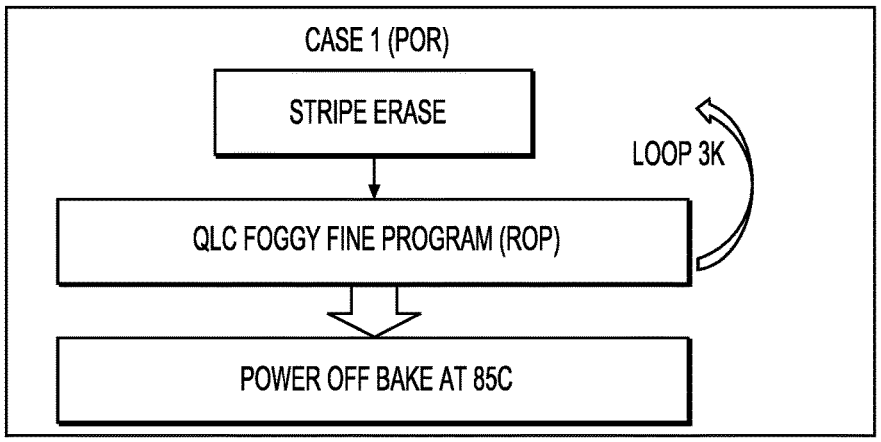
FIGS. 13A and 13B show a test methodology for a memory apparatus not employing a dummy cycle after cycling with a stripe erase (case 1) and for another memory apparatus employing the dummy cycle after cycling with the stripe erase (case 2), respectively according to aspects of the disclosure.
Figure 13B:
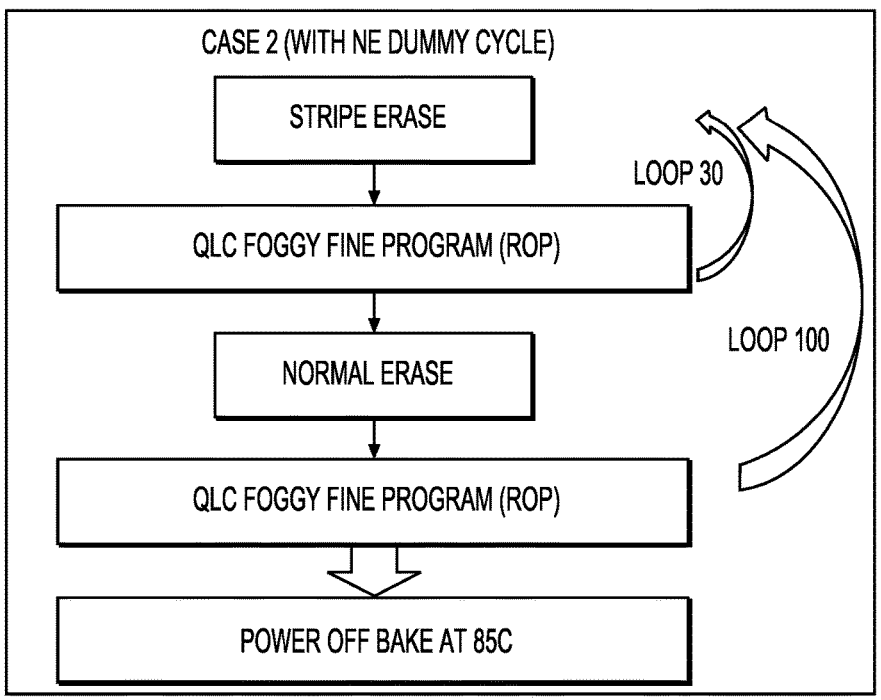
Figure 14:
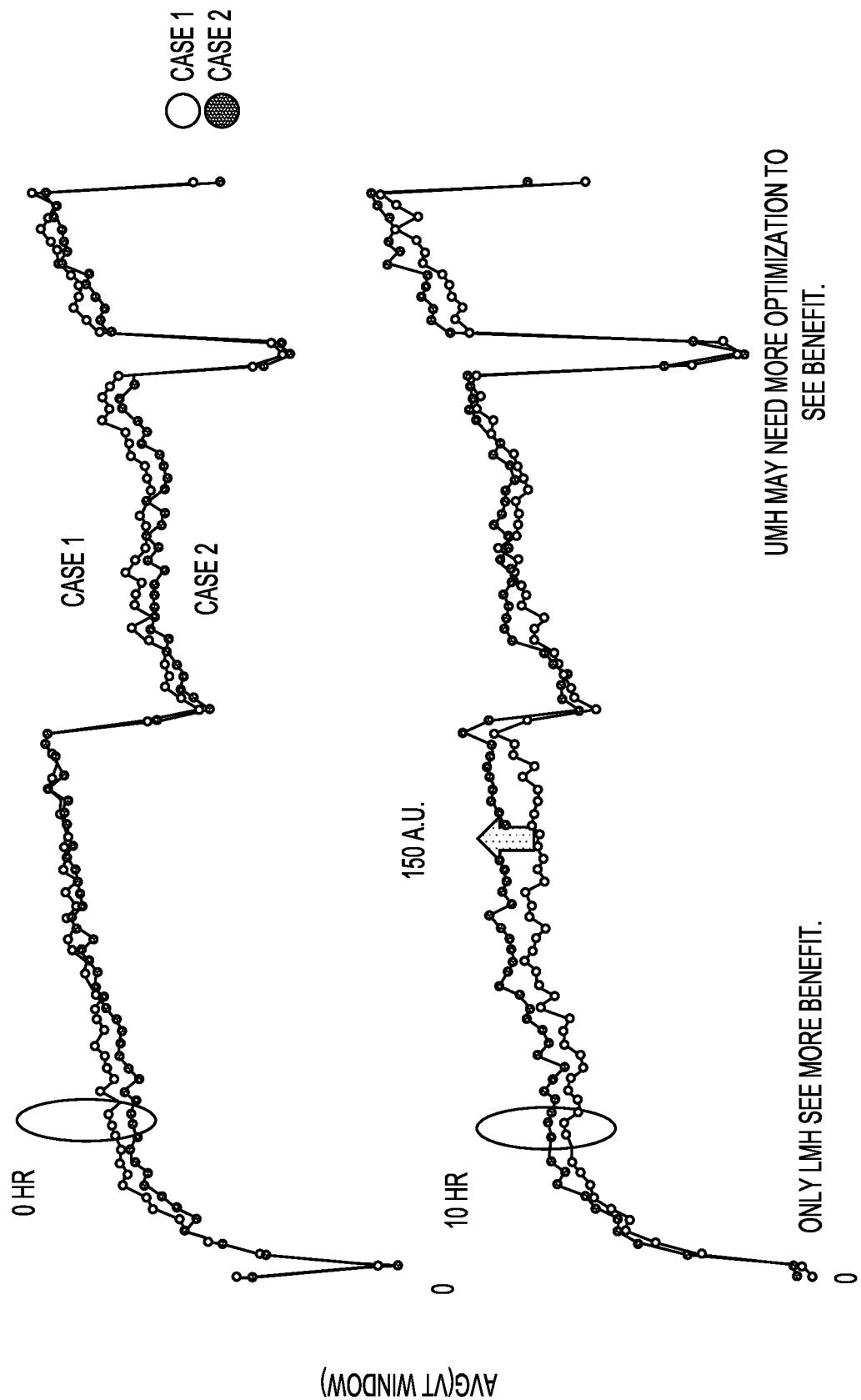
FIG. 14 shows a plot of the threshold voltage window for a plurality of word lines for both memory apparatuses (case 1 and case 2) according to aspects of the disclosure.

FIGS. 13A and 13B show a test methodology for a memory apparatus not employing a dummy cycle after cycling with a stripe erase operation (case 1) and for another memory apparatus employing the dummy cycle operation after cycling with the stripe erase operation (case 2), respectively. In FIG. 13A (case 1), no dummy cycle operation using a normal erase operation is utilized. However, as shown in FIG. 13B (case 2), during cycling, a dummy cycle operation using a normal erase is inserted to remove excessive electron in the parasitic region. FIG. 14 shows a plot of the threshold voltage window for a plurality of word lines for both memory apparatuses (case 1 and case 2). As shown, the dummy cycle operation using the normal erase operation can improve data retention. Specifically, data retention improvement varies by word line (~150 a.u for 10 hour high temperature data retention (HTDR) bake).

FIGS. 15 and 16 show threshold voltages Vt after high temperature data retention testing (i.e., 85 C) for various lengths of time for one particular word line that has been cycled (3000 cycles). Similarly, FIGS. 17A and 17B show state dependent threshold voltage Vt windows after 0 hours (FIG. 17A) and after 10 hours (FIG. 17B). At 0 hr, each state has similar state threshold voltage Vt window. After 10 hours in a high temperature (i.e., 85 C) bake, case 2 shows significant less threshold voltage Vt window loss. Thus, the memory apparatus and method disclosed herein provide various advantages including, but not limited to improving data retention for the stripe erase operation following cycling.

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," "top", "bottom", and the like, may be used herein for ease of description to describe one element's or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptions used herein interpreted accordingly.

What is claimed is:

1. A memory apparatus, comprising:
memory cells connected to one of a plurality of word lines and arranged in strings and configured to retain a threshold voltage corresponding to one of a plurality of memory states; and
a control circuit coupled to the plurality of word lines and strings and configured to:
erase the memory cells using a stripe erase operation in response to determining a cycle count of stripe erase cycles is less than a predetermined cycle count maximum threshold, and
perform a dummy cycle operation in response to determining the cycle count of stripe erase cycles is not less than the predetermined cycle count maximum threshold.

2. The memory apparatus as set forth in claim 1, wherein the plurality of word lines and a plurality of dielectric layers overlay one another in an alternating fashion in a stack, the plurality of word lines include a plurality of even word lines comprising every other ones of the plurality of word lines and a plurality of odd word lines each disposed between ones of the plurality of even word lines, and the control circuit further configured to:
apply an erase voltage to each of the strings while simultaneously applying a word line erase voltage to the plurality of even word lines associated with a selected block to encourage erasing of the memory cells corresponding with the plurality of even word lines and applying a word line inhibit voltage to the plurality of odd word lines associated with the selected block to discourage erasing of the memory cells corresponding with the plurality of odd word lines during the stripe erase operation; and
apply the erase voltage to each of the strings while simultaneously applying the word line erase voltage to the plurality of odd word lines associated with the selected block to encourage erasing of the memory cells corresponding with the plurality of odd word lines and applying the word line inhibit voltage to the plurality of even word lines associated with the selected block to discourage erasing of the memory cells corresponding with the plurality of even word lines during the stripe erase operation.

3. The memory apparatus as set forth in claim 2, wherein the dummy cycle operation includes a normal erase operation followed by a manual block write operation and the control circuit is further configured to:
apply the erase voltage to each of the strings while simultaneously applying the word line erase voltage to both the plurality of odd word lines and the plurality of even word lines associated with the selected block to encourage erasing of the memory cells corresponding with both the plurality of odd word lines and the plurality of even word lines during the normal erase operation; and
apply a manual write voltage to both the plurality of odd word lines and the plurality of even word lines associated with the selected block to raise the threshold voltage of the memory cells corresponding with both the plurality of odd word lines and the plurality of even word lines during the manual block write operation.

4. The memory apparatus as set forth in claim 3, wherein the control circuit is further configured to:
determine whether the cycle count is less than the predetermined cycle count maximum threshold;
program the memory cells during a program operation following erasing the memory cells using the stripe erase operation in response to determining the cycle count is less than the predetermined cycle count maximum threshold;
increment the cycle count and return to determine whether the cycle count is less than the predetermined cycle count maximum threshold;
erase the memory cells using the stripe erase operation following the normal erase operation and the manual block write in response to determining the cycle count is not less than the predetermined cycle count maximum threshold;
program the memory cells during the program operation; and
set the cycle count to zero and return to determine whether the cycle count is less than the predetermined cycle count maximum threshold.

5. The memory apparatus as set forth in claim 3, wherein the erase voltage applied by the control circuit during the normal erase is lower than the erase voltage applied by the control circuit during the stripe erase operation.

6. The memory apparatus as set forth in claim 3, wherein the threshold voltage possible for each of the memory cells spans a threshold window partitioned into a plurality of regions for the plurality of memory states including an erased state associated with one of the plurality of regions corresponding to the threshold voltage being lower compared to others of the plurality of regions representing at least one programmed state and the manual write voltage applied by the control circuit during the manual block write is selected to minimally raise the threshold voltage of the memory cells to one of a plurality of lower threshold voltages adjacent the erased state.

7. The memory apparatus as set forth in claim 3, wherein the memory cells comprise annular layers including a blocking oxide layer and a charge-trapping layer extending vertically through the stack and the predetermined cycle count maximum threshold is selected based on at least one of an erase depth of the stripe erase operation and characteristics of the annular layers.

8. The memory apparatus as set forth in claim 2, wherein the memory cells comprise annular layers including a blocking oxide layer and a charge-trapping layer extending vertically through the stack, the blocking oxide layer separating the charge-trapping layer from the each of the plurality of word lines to block charges in the charge-trapping layer from reaching each of the plurality of word lines, a parasitic region being defined in the charge-trapping layer vertically between adjacent ones of the plurality of word lines and horizontally aligned with each of the plurality of dielectric layers of the stack, the control circuit further configured to reduce accumulation of electrons in the parasitic region.

9. A controller in communication with a memory apparatus including memory cells connected to one of a plurality of word lines and arranged in strings and configured to retain a threshold voltage corresponding to one of a plurality of memory states, the controller configured to:
 instruct the memory apparatus to erase the memory cells using a stripe erase operation in response to determining a cycle count of stripe erase cycles is less than a predetermined cycle count maximum threshold; and
 instruct the memory apparatus to perform a dummy cycle operation in response to determining the cycle count of stripe erase cycles is not less than the predetermined cycle count maximum threshold.

10. The controller as set forth in claim 9, wherein the plurality of word lines and a plurality of dielectric layers overlay one another in an alternating fashion in a stack, the plurality of word lines include a plurality of even word lines comprising every other ones of the plurality of word lines and a plurality of odd word lines each disposed between ones of the plurality of even word lines, and the controller is further configured to:
 instruct the memory apparatus to apply an erase voltage to each of the strings while simultaneously applying a word line erase voltage to the plurality of even word lines associated with a selected block to encourage erasing of the memory cells corresponding with the plurality of even word lines and applying a word line inhibit voltage to the plurality of odd word lines associated with the selected block to discourage erasing of the memory cells corresponding with the plurality of odd word lines during the stripe erase operation; and
 instruct the memory apparatus to apply the erase voltage to each of the strings while simultaneously applying the word line erase voltage to the plurality of odd word lines associated with the selected block to encourage erasing of the memory cells corresponding with the plurality of odd word lines and applying the word line inhibit voltage to the plurality of even word lines associated with the selected block to discourage erasing of the memory cells corresponding with the plurality of even word lines during the stripe erase operation.

11. The controller as set forth in claim 10, wherein the dummy cycle operation includes a normal erase operation followed by a manual block write operation and the controller is further configured to:
 instruct the memory apparatus to apply the erase voltage to each of the strings while simultaneously applying the word line erase voltage to both the plurality of odd word lines and the plurality of even word lines associated with the selected block to encourage erasing of the memory cells corresponding with both the plurality of odd word lines and the plurality of even word lines during the normal erase operation; and
 instruct the memory apparatus to apply a manual write voltage to both the plurality of odd word lines and the plurality of even word lines associated with the selected block to raise the threshold voltage of the memory cells corresponding with both the plurality of odd word lines and the plurality of even word lines during the manual block write operation.

12. The controller as set forth in claim 11, wherein the controller is further configured to:
 determine whether the cycle count is less than the predetermined cycle count maximum threshold;
 instruct the memory apparatus to program the memory cells during a program operation following erasing the memory cells using the stripe erase operation in response to determining the cycle count is less than the predetermined cycle count maximum threshold;
 increment the cycle count and return to determine whether the cycle count is less than the predetermined cycle count maximum threshold;
 instruct the memory apparatus to erase the memory cells using the stripe erase operation following the normal erase operation and the manual block write in response to determining the cycle count is not less than the predetermined cycle count maximum threshold;
 instruct the memory apparatus to program the memory cells during the program operation; and
 set the cycle count to zero and return to determine whether the cycle count is less than the predetermined cycle count maximum threshold.

13. The controller as set forth in claim 11, wherein the erase voltage applied by the memory apparatus during the normal erase is lower than the erase voltage applied by the memory apparatus during the stripe erase operation.

14. The controller as set forth in claim 11, wherein the threshold voltage possible for each of the memory cells spans a threshold window partitioned into a plurality of regions for the plurality of memory states including an erased state associated with one of the plurality of regions corresponding to the threshold voltage being lower compared to others of the plurality of regions representing at least one programmed state and the manual write voltage applied by the memory apparatus during the manual block write is selected to minimally raise the threshold voltage of the memory cells to one of a plurality of lower threshold voltages adjacent the erased state.

15. A method of operating a memory apparatus including memory cells connected to one of a plurality of word lines and arranged in strings and configured to retain a threshold voltage corresponding to one of a plurality of memory states, the method comprising the steps of:
 erasing the memory cells using a stripe erase operation in response to determining a cycle count of stripe erase cycles is less than a predetermined cycle count maximum threshold; and
 performing a dummy cycle operation in response to determining the cycle count of stripe erase cycles is not less than the predetermined cycle count maximum threshold.

16. The method as set forth in claim 15, wherein the plurality of word lines and a plurality of dielectric layers overlay one another in an alternating fashion in a stack, the plurality of word lines include a plurality of even word lines comprising every other ones of the plurality of word lines and a plurality of odd word lines each disposed between ones of the plurality of even word lines, and the method further includes the steps of:
 applying an erase voltage to each of the strings while simultaneously applying a word line erase voltage to the plurality of even word lines associated with a selected block to encourage erasing of the memory cells corresponding with the plurality of even word lines and applying a word line inhibit voltage to the plurality of odd word lines associated with the selected block to discourage erasing of the memory cells corresponding with the plurality of odd word lines during the stripe erase operation; and
 applying the erase voltage to each of the strings while simultaneously applying the word line erase voltage to the plurality of odd word lines associated with the selected block to encourage erasing of the memory cells corresponding with the plurality of odd word lines and applying the word line inhibit voltage to the plurality of even word lines associated with the selected block to discourage erasing of the memory cells corresponding with the plurality of even word lines during the stripe erase operation.

17. The method as set forth in claim 16, wherein the dummy cycle operation includes a normal erase operation followed by a manual block write operation and the method further includes the steps of:
   applying the erase voltage to each of the strings while simultaneously applying the word line erase voltage to both the plurality of odd word lines and the plurality of even word lines associated with the selected block to encourage erasing of the memory cells corresponding with both the plurality of odd word lines and the plurality of even word lines during the normal erase operation; and
   applying a manual write voltage to both the plurality of odd word lines and the plurality of even word lines associated with the selected block to raise the threshold voltage of the memory cells corresponding with both the plurality of odd word lines and the plurality of even word lines during the manual block write operation.

18. The method as set forth in claim 17, further including the steps of:
   determining whether the cycle count is less than the predetermined cycle count maximum threshold;
   programming the memory cells during a program operation following erasing the memory cells using the stripe erase operation in response to determining the cycle count is less than the predetermined cycle count maximum threshold;
   incrementing the cycle count and returning to determine whether the cycle count is less than the predetermined cycle count maximum threshold;
   erasing the memory cells using the stripe erase operation following the normal erase operation and the manual block write in response to determining the cycle count is not less than the predetermined cycle count maximum threshold;
   programming the memory cells during the program operation; and
   setting the cycle count to zero and returning to determine whether the cycle count is less than the predetermined cycle count maximum threshold.

19. The method as set forth in claim 17, wherein the erase voltage applied by the memory apparatus during the normal erase is lower than the erase voltage applied by the memory apparatus during the stripe erase operation.

20. The method as set forth in claim 17, wherein the threshold voltage possible for each of the memory cells spans a threshold window partitioned into a plurality of regions for the plurality of memory states including an erased state associated with one of the plurality of regions corresponding to the threshold voltage being lower compared to others of the plurality of regions representing at least one programmed state and the manual write voltage applied by the memory apparatus during the manual block write is selected to minimally raise the threshold voltage of the memory cells to one of a plurality of lower threshold voltages adjacent the erased state.

* * * * *